US008815695B2

(12) United States Patent
Rui et al.

(10) Patent No.: US 8,815,695 B2
(45) Date of Patent: Aug. 26, 2014

(54) METHODS TO IMPROVE LEAKAGE FOR ZRO2 BASED HIGH K MIM CAPACITOR

(71) Applicants: Intermolecular, Inc., San Jose, CA (US); Elpida Memory, Inc, Tokyo (JP)

(72) Inventors: Xiangxin Rui, Campbell, CA (US); Mitsuhiro Horikawa, Higashihiroshima (JP); Hiroyuki Ode, Higashihiroshima (JP); Karthik Ramani, Santa Clara, CA (US)

(73) Assignees: Intermolecular, Inc., San Jose, CA (US); Elpida Memory, Inc., Tokyo (JP)

(*) Notice: Subject to any disclaimer, the term of this patent is extended or adjusted under 35 U.S.C. 154(b) by 0 days.

(21) Appl. No.: 13/727,898

(22) Filed: Dec. 27, 2012

(65) Prior Publication Data

US 2014/0187015 A1    Jul. 3, 2014

(51) Int. Cl.
*H01L 21/02* (2006.01)
*H01L 27/108* (2006.01)
*H01L 29/92* (2006.01)
*H01L 21/8242* (2006.01)
*H01L 21/316* (2006.01)
*H01L 27/04* (2006.01)
*H01L 49/02* (2006.01)

(52) U.S. Cl.
CPC ........................................ *H01L 28/40* (2013.01)
USPC ............ 438/381; 438/171; 438/190; 438/210; 438/239; 438/244; 257/306; 257/516; 257/532

(58) Field of Classification Search
CPC ... H01L 28/40; H01L 28/75; H01L 21/02186; H01L 21/0228; H01L 27/1085; H01L 27/285
USPC ................ 438/381, 171, 190, 210, 239, 244; 257/306, 516, 532

See application file for complete search history.

(56) References Cited

U.S. PATENT DOCUMENTS

| | | | |
|---|---|---|---|
| 6,479,849 B1 * | 11/2002 | Katori | 257/296 |
| 6,541,332 B2 | 4/2003 | Song | |
| 7,582,893 B2 | 9/2009 | Sokolik et al. | |
| 8,129,797 B2 | 3/2012 | Chen et al. | |
| 2003/0045068 A1 * | 3/2003 | Gutsche et al. | 438/386 |
| 2003/0060003 A1 * | 3/2003 | Hecht et al. | 438/240 |
| 2004/0152255 A1 * | 8/2004 | Seidl et al. | 438/240 |
| 2007/0048953 A1 * | 3/2007 | Gealy et al. | 438/305 |
| 2009/0065896 A1 * | 3/2009 | Hwang | 257/532 |
| 2010/0047989 A1 * | 2/2010 | Lee | 438/381 |
| 2010/0172065 A1 * | 7/2010 | Huang et al. | 361/313 |
| 2010/0200950 A1 | 8/2010 | Kim et al. | |
| 2011/0204475 A1 * | 8/2011 | Rui et al. | 257/532 |
| 2012/0171839 A1 | 7/2012 | Chen et al. | |
| 2012/0214288 A1 | 8/2012 | Chen et al. | |
| 2012/0287553 A1 * | 11/2012 | Ramani et al. | 361/301.4 |
| 2013/0001743 A1 * | 1/2013 | Frank | 257/532 |
| 2013/0122678 A1 * | 5/2013 | Malhotra et al. | 438/381 |

\* cited by examiner

*Primary Examiner* — Shaun Campbell
*Assistant Examiner* — Thai T Vuong

(57) ABSTRACT

A first electrode layer for a Metal-Insulator-Metal (MIM) DRAM capacitor is formed wherein the first electrode layer contains a conductive base layer and conductive metal oxide layer. A second electrode layer for a Metal-Insulator-Metal (MIM) DRAM capacitor is formed wherein the second electrode layer contains a conductive base layer and conductive metal oxide layer. In some embodiments, both the first electrode layer and the second electrode layer contain a conductive base layer and conductive metal oxide layer.

19 Claims, 13 Drawing Sheets

METHODS TO IMPROVE LEAKAGE FOR ZRO2 BASED HIGH K MIM CAPACITOR

This document relates to the subject matter of a joint research agreement between Intermolecular, Inc. and Elpida Memory, Inc

FIELD OF THE DISCLOSURE

The present disclosure relates generally to the use of non-noble metal electrodes in capacitors used in Dynamic Random Access Memory (DRAM) devices.

BACKGROUND OF THE DISCLOSURE

Dynamic Random Access Memory utilizes capacitors to store bits of information within an integrated circuit. A capacitor is formed by placing a dielectric material between two electrodes formed from conductive materials. A capacitor's ability to hold electrical charge (i.e., capacitance) is a function of the surface area of the capacitor plates A, the distance between the capacitor plates d (i.e. the physical thickness of the dielectric layer), and the relative dielectric constant or k-value of the dielectric material. The capacitance is given by:

$$C = \kappa \varepsilon_o \frac{A}{d} \quad \text{(Eqn. 1)}$$

where $\varepsilon_0$ represents the vacuum permittivity.

The dielectric constant is a measure of a material's polarizability. Therefore, the higher the dielectric constant of a material, the more electrical charge the capacitor can hold. Therefore, for a given desired capacitance, if the k-value of the dielectric is increased, the area of the capacitor can be decreased to maintain the same cell capacitance. Reducing the size of capacitors within the device is important for the miniaturization of integrated circuits. This allows the packing of millions (mega-bit (Mb)) or billions (giga-bit (Gb)) of memory cells into a single semiconductor device. The goal is to maintain a large cell capacitance (generally ~10 to 25 fF) and a low leakage current (generally $<10^{-7}$ A $cm^{-2}$). The physical thickness of the dielectric layers in DRAM capacitors could not be reduced unlimitedly in order to avoid leakage current caused by tunneling mechanisms which exponentially increases as the thickness of the dielectric layer decreases.

Traditionally, $SiO_2$ has been used as the dielectric material and semiconducting materials (semiconductor-insulator-semiconductor [SIS] cell designs) have been used as the electrodes. The cell capacitance was maintained by increasing the area of the capacitor using very complex capacitor morphologies while also decreasing the thickness of the $SiO_2$ dielectric layer. Increases of the leakage current above the desired specifications have demanded the development of new capacitor geometries, new electrode materials, and new dielectric materials. Cell designs have migrated to metal-insulator-semiconductor (MIS) and now to metal-insulator-metal (MIM) cell designs for higher performance.

Typically, DRAM devices at technology nodes of 80 nm and below use MIM capacitors wherein the electrode materials are metals. These electrode materials generally have higher conductivities than the semiconductor electrode materials, higher work functions, exhibit improved stability over the semiconductor electrode materials, and exhibit reduced depletion effects. The electrode materials must have high conductivity to ensure fast device speeds. Representative examples of electrode materials for MIM capacitors are metals, conductive metal oxides, conductive metal silicides, conductive metal nitrides (i.e. TiN), or combinations thereof. MIM capacitors in these DRAM applications utilize insulating materials having a dielectric constant, or k-value, significantly higher than that of $SiO_2$ (k=3.9). For DRAM capacitors, the goal is to utilize dielectric materials with k values greater than about 20. Such materials are generally classified as high-k materials. Representative examples of high-k materials for MIM capacitors are non-conducting metal oxides, non-conducting metal nitrides, non-conducting metal silicates or combinations thereof. These dielectrics may also include additional dopant materials.

One class of high-k dielectric materials possessing the characteristics required for implementation in advanced DRAM capacitors are high-k metal oxide materials. Titanium oxide is a metal oxide dielectric material which displays significant promise in terms of serving as a high-k dielectric material for implementation in DRAM capacitors.

The dielectric constant of a dielectric material may be dependent upon the crystalline phase(s) of the material. For example, in the case of titanium oxide, the anatase crystalline phase of titanium oxide has a dielectric constant of approximately 40, while the rutile crystalline phase of titanium oxide can have a dielectric constant of approximately >80. Due to the higher-k value of the rutile-phase, it is desirable to produce titanium oxide based DRAM capacitors with the titanium oxide in the rutile-phase. The relative amounts of the anatase phase and the rutile phase can be determined from x-ray diffraction (XRD). From Eqn. 1 above, a titanium oxide layer in the rutile-phase could be physically thicker and maintain the desired capacitance. The increased physical thickness is important for lowering the leakage current of the capacitor. The anatase phase will transition to the rutile phase at high temperatures (>800 C). However, high temperature processes are undesirable in the manufacture of DRAM devices.

The crystal phase of an underlying layer can be used to influence the growth of a specific crystal phase of a subsequent material if their crystal structures are similar and their lattice constants are similar. This technique is well known in technologies such as epitaxial growth. The same concepts have been extended to the growth of thin films where the underlying layer can be used as a "template" to encourage the growth of a desired phase over other competing crystal phases.

Conductive metal oxides, conductive metal silicides, conductive metal nitrides, conductive metal carbides, or combinations thereof are examples of other classes of materials that may be suitable as DRAM capacitor electrodes. Generally, transition metals and their conductive binary compounds form good candidates as electrode materials. The transition metals exist in several oxidation states. Therefore, a wide variety of compounds are possible. Different compounds may have different crystal structures, electrical properties, etc. It is important to utilize the proper compound for the desired application.

In one example, molybdenum has several binary oxides of which $MoO_2$ and $MoO_3$ are two examples. These two oxides of molybdenum have different properties. $MoO_2$ has shown great promise as an electrode material in DRAM capacitors. $MoO_2$ has a distorted rutile crystal structure and serves as an acceptable template to promote the deposition of the rutile-phase of $TiO_2$ as discussed above. $MoO_2$ also has a high work function (can be >5.0 eV depending on process history) which helps to minimize the leakage current of the DRAM device. However, oxygen-rich phases ($MoO_{2+x}$) degrade the performance of the $MoO_2$ electrode because they do not promote the deposition of the rutile-phase of $TiO_2$. For example, $MoO_3$ (the most oxygen-rich phase) has an orthorhombic crystal structure.

Generally, a deposited thin film may be amorphous, crystalline, or a mixture thereof. Furthermore, several different crystalline phases may exist. Therefore, processes (both deposition and post-treatment) must be developed to maximize the formation of crystalline $MoO_2$ and to minimize the presence of $MoO_{2+x}$ phases. Deposition processes and post-treatment processes in a reducing atmosphere have been developed that allow crystalline $MoO_2$ to be used as the first electrode (i.e. bottom electrode) in MIM DRAM capacitors with titanium oxide or doped-titanium oxide high-k dielectric materials. Examples of the post-treatment process are further described in U.S. application Ser. No. 13/084,666 filed on Apr. 12, 2011, entitled "METHOD FOR FABRICATING A DRAM CAPACITOR" which is incorporated herein by reference. Other conductive metal oxides that may be used as a template for the rutile phase of titanium oxide include the conductive compounds of molybdenum oxide, tungsten oxide, ruthenium oxide, iron oxide, iridium oxide, chromium oxide, manganese oxide, tin oxide, cobalt oxide, or nickel oxide.

As used herein, the phrase "conductive metal oxide" will be understood to include the typical stoichiometric metal oxides as well as conductive non-stoichiometric metal oxides wherein the oxygen to metal ratio is not equal to the stoichiometric ratio. As an example, "conductive molybdenum oxide" will include $MoO_2$ as well as those conductive molybdenum oxides wherein the oxygen to metal ratio is slightly greater than or slightly less than 2. Those skilled in the art will understand that metal-oxygen compounds that are slightly off of the stoichiometric ratio will also be conductive and will fall within the scope of the present disclosure. As used herein, the phrase "conductive metal oxide" will be understood to include metal oxide materials having a resistivity of less than about 10 Ωcm.

Therefore, there is a need to develop processes that allow the formation of a conductive metal oxide electrode layers (e.g. first electrode and/or second electrode) that can serve as a template for the rutile phase of titanium oxide (e.g. first electrode embodiments), and have high work function values to reduce the leakage current density through the device.

SUMMARY OF THE DISCLOSURE

In some embodiments, a conductive metal oxide first electrode layer is formed as part of a MIM DRAM capacitor stack. In some embodiments, a metal oxide layer is formed as part of a bilayer first electrode of a MIM DRAM capacitor stack.

In some embodiments, a metal oxide second electrode layer is formed as part of a MIM DRAM capacitor stack. In some embodiments, a metal oxide layer is formed as part of a bilayer second electrode of a MIM DRAM capacitor stack.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present disclosure can readily be understood by considering the following detailed description in conjunction with the accompanying drawings, in which.

DETAILED DESCRIPTION

Figure 1:
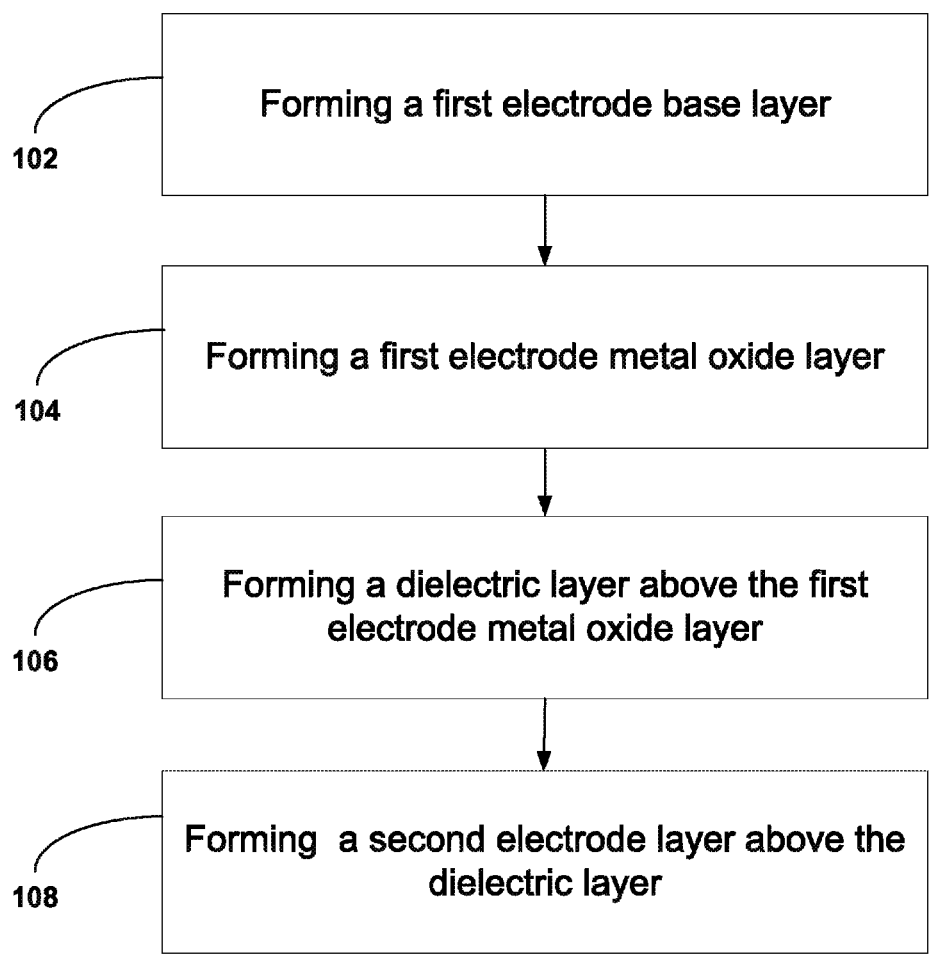
FIG. 1 illustrates a flow chart illustrating a method for fabricating a DRAM capacitor stack in accordance with some embodiments.

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

It must be noted that as used herein and in the claims, the singular forms "a," "and" and "the" include plural referents unless the context clearly dictates otherwise. Thus, for example, reference to "a layer" also includes two or more layers, and so forth. As an example, those skilled in the art will understand that an "electrode layer" may include a single layer or may include a "bilayer" of two materials.

Leakage current in capacitor dielectric materials can be due to Schottky emission, Frenkel-Poole defects (e.g. oxygen vacancies ($V_{ox}$) or grain boundaries), or Fowler-Nordheim tunneling. Schottky emission, also called thermionic emission, is a common mechanism and is the thermally activated flow of charge over an energy barrier whereby the effective barrier height of a MIM capacitor controls leakage current. The nominal barrier height is a function of the difference between the work function of the electrode and the electron affinity of the dielectric. The electron affinity of a dielectric is closely related to the conduction band offset of the dielectric. The Schottky emission behavior of a dielectric layer is generally determined by the properties of the dielectric/electrode interface. Frenkel-Poole emission allows the conduction of charges through a dielectric layer through the interaction with defect sites such as vacancies, grain boundaries, and the like. As such, the Frenkel-Poole emission behavior of a dielectric layer is generally determined by the dielectric layer's bulk properties. Fowler-Nordheim emission allows the conduction of charges through a dielectric layer through direct tunneling without any intermediary interaction with e.g. defects. As such, the Fowler-Nordheim emission behavior of a dielectric layer is generally determined by the physical thickness of the dielectric layer. This leakage current is a primary driving force in the adoption of high-k dielectric materials. The use of high-k materials allows the physical thickness of the dielectric layer to be as thick as possible while maintaining the required capacitance (see Eqn 1 above).

As discussed previously, materials with a high k value generally have a small band gap. The small band gap leads to high leakage current through the Schottky emission mechanism due to the small barrier height. The leakage current may be reduced through the use of a blocking layer that has a higher band gap. Some metal oxide materials have a high work function and may be suitable as blocking layers. These layers may be used at one or both electrodes of the capacitor stack to reduce the leakage current. The benefits of the blocking layers may be realized if they are thin (e.g. have a thickness of less than about 15 A), are amorphous (e.g. are less than 30% crystalline after subsequent anneal steps), and are poor conductors (e.g. have resistivity values greater than about 0.01 ohm-cm). The blocking layers must be thick enough to lower the leakage current, but as thin as possible so that they do not decrease the k value of the capacitor stack and increase the EOT. As used herein, blocking layers that are positioned between the first (e.g. bottom) electrode and the dielectric layer may be labeled a "flash layer"). As used herein, blocking layers that are positioned between the second (e.g. top) electrode and the dielectric layer may be labeled a "capping layer").

FIG. 1 describes a method, 100, for fabricating a DRAM capacitor stack. The capacitor stack includes a first electrode layer, a dielectric layer, and a second electrode layer. The first electrode layer may include a single layer or may include multiple layers as discussed previously. The initial step, 102, includes forming a first electrode base layer above a substrate. Examples of suitable first electrode base layers include metals, conductive metal oxides, conductive metal silicides, conductive metal nitrides, and combinations thereof. A particularly interesting class of materials for the first electrode base layer is the conductive metal nitrides. The next step, 104, includes forming a first electrode metal oxide layer (i.e. blocking layer) above the first electrode base layer. Examples of such metal oxides include the compounds of molybdenum oxide, tungsten oxide, ruthenium oxide, iridium oxide, chromium oxide, manganese oxide, cerium oxide, europium oxide, or tin oxide. Specific metal oxide materials of interest are the compounds of molybdenum oxide, ruthenium oxide, manganese oxide, tungsten oxide, cerium oxide, europium oxide, and tin oxide. Typically, metal oxide layers are deposited using atomic layer deposition (ALD) processes. The metal oxide layer may be deposited using a high temperature, low pressure ALD process as described in co-owned U.S. patent application Ser. No. 13/622,947, entitled "HIGH TEMPERATURE ALD PROCESS FOR METAL OXIDE FOR DRAM APPLICATIONS" filed on Sep. 19, 2012, which is herein incorporated by reference for all purposes. Together, the first electrode base layer and the first electrode metal oxide layer form the first electrode layer of the capacitor stack. The first electrode layer can then be subjected to an annealing process (not shown). The next step, 106, includes forming a dielectric layer above the first electrode layer. Optionally, the dielectric layer can then be subjected to a post dielectric anneal (PDA) treatment (not shown). The PDA step serves to crystallize the dielectric layer and fill oxygen vacancies. The next step, 108, includes forming a second electrode layer on the dielectric layer. The second electrode layer may include a single layer or may include multiple layers as discussed previously. Examples of suitable electrode materials include metals, conductive metal oxides, conductive metal silicides, conductive metal nitrides, and combinations thereof. Optionally, the capacitor stack can then be subjected to PMA treatment process in an oxidizing atmosphere, wherein the oxidizing atmosphere includes between 0% $O_2$ to 25% $O_2$ and at temperatures between 300 C to 600 C for between 1 millisecond to 60 minutes (not shown). Examples of the PDA and PMA treatments are further described in U.S. application Ser. No. 13/159,842 filed on Jun. 14, 2011, entitled "METHOD OF PROCESSING MIM CAPACITORS TO REDUCE LEAKAGE CURRENT" and is incorporated herein by reference for all purposes. Those skilled in the art will understand that other layers may be included in the capacitor stack. The benefits of the blocking layer may be realized if they are thin (e.g. have a thickness of less than about 15 A), are amorphous (e.g. are less than 30% crystalline after subsequent anneal steps), and are poor conductors (e.g. have resistivity values greater than about 0.01 ohm-cm). The blocking layers must be thick enough to lower the leakage current, but as thin as possible so that they do not decrease the k value of the capacitor stack and increase the EOT.

Figure 2:
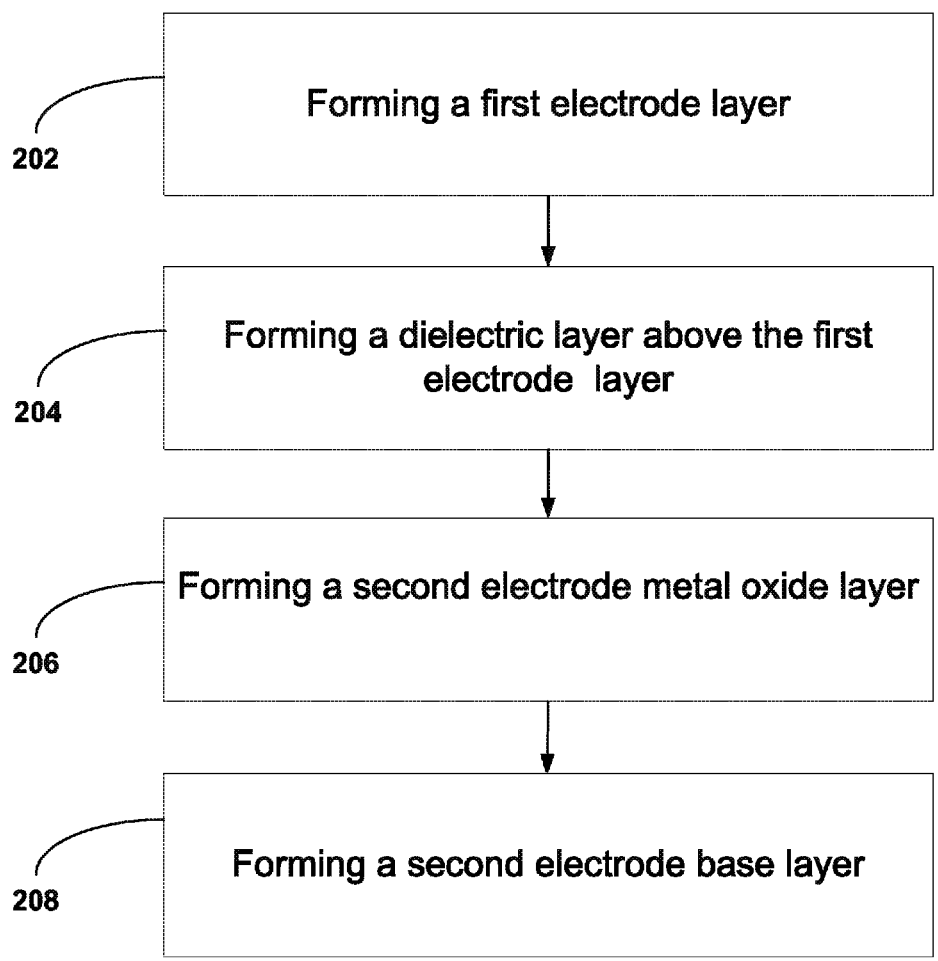
FIG. 2 illustrates a flow chart illustrating a method for fabricating a DRAM capacitor stack in accordance with some embodiments.

FIG. 2 describes a method, 200, for fabricating a DRAM capacitor stack. The capacitor stack includes a first electrode layer, a dielectric layer, and a second electrode layer. The initial step, 202, includes forming a first electrode layer above a substrate. The first electrode layer may include a single layer or may include multiple layers as discussed previously. The next step, 204, includes forming a dielectric layer above the first electrode layer. Optionally, the dielectric layer can then be subjected to a PDA treatment (not shown). The PDA step serves to crystallize the dielectric layer and fill oxygen vacancies. The next step, 206, includes forming a second electrode layer above the dielectric layer. The second electrode layer may include a single layer or may include multiple layers as discussed previously. The next step, 206, includes forming a second electrode metal oxide layer (i.e. blocking layer) above the dielectric layer. Examples of such metal oxides include the compounds of molybdenum oxide, tungsten oxide, ruthenium oxide, iridium oxide, chromium oxide, manganese oxide, cerium oxide, europium oxide, or tin oxide. Specific metal oxide materials of interest are the compounds of molybdenum oxide, ruthenium oxide, manganese oxide, tungsten oxide, cerium oxide, europium oxide, and tin oxide. Typically, metal oxide layers are deposited using atomic layer deposition (ALD) processes. The metal oxide layer may be deposited using a high temperature, low pressure ALD process as described previously. The next step, 208, includes forming a second electrode base layer above the metal oxide layer. Examples of suitable second electrode base layers include metals, conductive metal oxides, conductive metal silicides, conductive metal nitrides, and combinations thereof. In some embodiments, the conductive base layer includes one of ruthenium, platinum, titanium nitride, tantalum nitride, titanium-aluminum-nitride, tungsten, tungsten nitride, molybdenum, molybdenum nitride, or vanadium nitride. A particularly interesting class of materials for the second electrode base layer is the conductive metal nitrides. Together, the second electrode base layer and the second electrode metal oxide layer form the second electrode layer of the capacitor stack. Optionally, the capacitor stack can then be subjected to PMA treatment process in an oxidizing atmosphere, wherein the oxidizing atmosphere includes between 0% $O_2$ to 25% $O_2$ and at temperatures between 300 C to 600 C for between 1 millisecond to 60 minutes (not shown). Those skilled in the art will understand that other layers may be included in the capacitor stack. The benefits of the blocking layer may be realized if they are thin (e.g. have a thickness of less than about 15 A), are amorphous (e.g. are less than 30% crystalline after subsequent anneal steps), and are poor conductors (e.g. have resistivity values greater than about 0.01 ohm-cm). The blocking layers must be thick enough to lower the leakage current, but as thin as possible so that they do not decrease the k value of the capacitor stack and increase the EOT.

Figure 3:
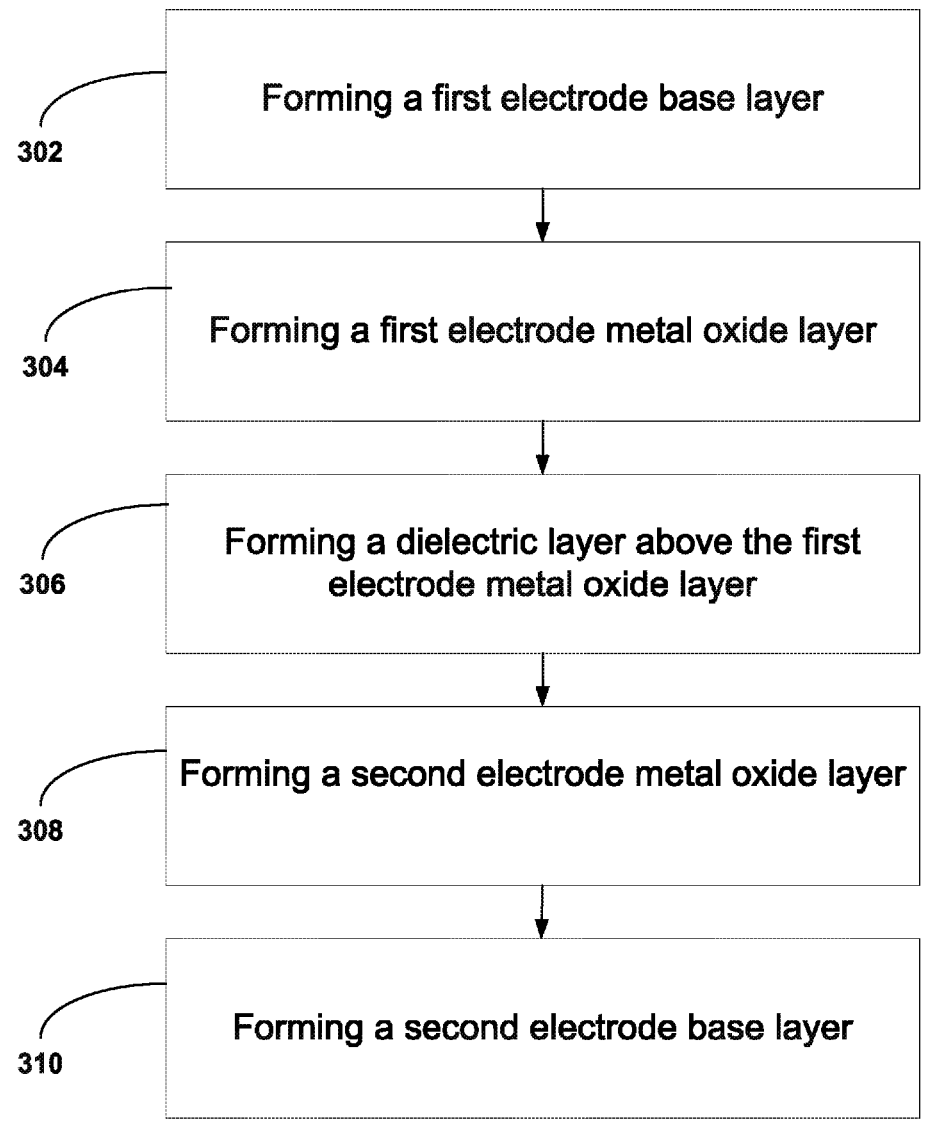
FIG. 3 illustrates a flow chart illustrating a method for fabricating a DRAM capacitor stack in accordance with some embodiments.

FIG. 3 describes a method, 300, for fabricating a DRAM capacitor stack. The capacitor stack includes a first electrode layer, a dielectric layer, and a second electrode layer. The first electrode layer may include a single layer or may include multiple layers as discussed previously. The initial step, 302, includes forming a first electrode base layer above a substrate. Examples of suitable first electrode base layers include metals, conductive metal oxides, conductive metal silicides, conductive metal nitrides, and combinations thereof. In some embodiments, the conductive base layer includes one of ruthenium, platinum, titanium nitride, tantalum nitride, titanium-aluminum-nitride, tungsten, tungsten nitride, molybdenum, molybdenum nitride, or vanadium nitride. A particularly interesting class of materials for the first electrode base layer is the conductive metal nitrides. The next step, 304, includes forming a first electrode metal oxide layer (i.e. blocking layer) above the first electrode base layer. Examples of such metal oxides include the compounds of molybdenum oxide, tungsten oxide, ruthenium oxide, iridium oxide, chromium oxide, manganese oxide, cerium oxide, europium oxide, or tin oxide. Specific metal oxide materials of interest are the compounds of molybdenum oxide, ruthenium oxide, manganese oxide, tungsten oxide, cerium oxide, europium oxide, and tin oxide. Typically, metal oxide layers are deposited using atomic layer deposition (ALD) processes. The metal oxide layer may be deposited using a high temperature, low pressure ALD process as described previously. Together, the first electrode base layer and the first electrode metal oxide layer form the first electrode layer of the capacitor stack. The first electrode layer can then be subjected to an annealing process (not shown). The next step, 306, includes forming a dielectric layer above the first electrode layer. Optionally, the dielectric layer can then be subjected to a post dielectric anneal (PDA) treatment (not shown). The PDA step serves to crystallize the dielectric layer and fill oxygen vacancies. The next step, 206, includes forming a second electrode layer above the dielectric layer. The second electrode layer may include a single layer or may include multiple layers as discussed previously. The next step, 308, includes forming a second electrode metal oxide layer (i.e. blocking layer) above the dielectric layer. Examples of such metal oxides include the compounds of molybdenum oxide, tungsten oxide, ruthenium oxide, iridium oxide, chromium oxide, manganese oxide, cerium oxide, europium oxide, or tin oxide. Specific metal oxide materials of interest are the compounds of molybdenum oxide, ruthenium oxide, manganese oxide, tungsten oxide, cerium oxide, europium oxide, and tin oxide. Typically, metal oxide layers are deposited using atomic layer deposition (ALD) processes. The metal oxide layer may be deposited using a high temperature, low pressure ALD process as described previously. The next step, 310, includes forming a second electrode base layer above the conductive metal oxide layer. Examples of suitable second electrode base layers include metals, conductive metal oxides, conductive metal silicides, conductive metal nitrides, and combinations thereof. In some embodiments, the conductive base layer includes one of ruthenium, platinum, titanium nitride, tantalum nitride, titanium-aluminum-nitride, tungsten, tungsten nitride, molybdenum, molybdenum nitride, or vanadium nitride. A particularly interesting class of materials for the second electrode base layer is the conductive metal nitrides. Together, the second electrode base layer and the second electrode metal oxide layer form the second electrode layer of the capacitor stack. Optionally, the capacitor stack can then be subjected to PMA treatment process in an oxidizing atmosphere, wherein the oxidizing atmosphere includes between 0% $O_2$ to 25% $O_2$ and at temperatures between 300 C to 600 C for between 1 millisecond to 60 minutes (not shown). Those skilled in the art will understand that other layers may be included in the capacitor stack. The benefits of the blocking layer may be realized if they are thin (e.g. have a thickness of less than about 15 A), are amorphous (e.g. are less than 30% crystalline after subsequent anneal steps), and are poor conductors (e.g. have resistivity values greater than about 0.01 ohm-cm). The blocking layers must be thick enough to lower the leakage current, but as thin as possible so that they do not decrease the k value of the capacitor stack and increase the EOT.

Those skilled in the art will appreciate that the formation of each of the first electrode layer, the dielectric layer, and the second electrode structure used in the MIM DRAM capacitor has been described using a generic ALD process. However, any of the variants of the generic ALD process may also be implemented. Common variants include plasma enhanced atomic layer deposition (PE-ALD), atomic vapor deposition (AVD), and ultraviolet assisted atomic layer deposition (UV-ALD), etc. Generally, because of the complex morphology of the DRAM capacitor structure, ALD, PE-ALD, AVD, or UV-ALD are preferred methods of formation. However, any of these techniques are suitable for forming each of the various layers discussed herein. Those skilled in the art will appreciate that the teachings described herein are not limited by the variant of the ALD technology used for the deposition process.

In FIGS. 4-6 and 9-11 below, a capacitor stack is illustrated using a simple planar structure. Those skilled in the art will appreciate that the description and teachings to follow can be readily applied to any simple or complex capacitor morphology. The drawings are for illustrative purposes only and do not limit the application of the present invention.

Figure 4:
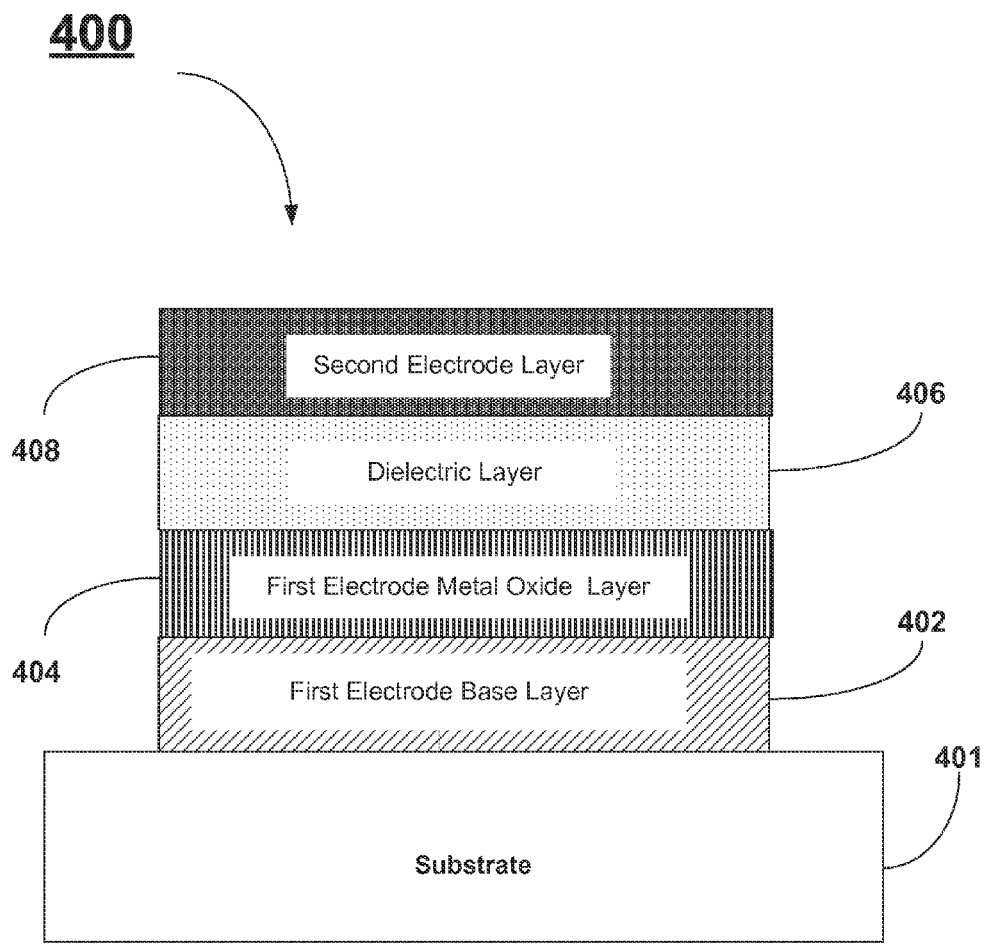
FIG. 4 illustrates a simplified cross-sectional view of a DRAM capacitor stack fabricated in accordance with some embodiments.

FIG. 4 illustrates a simple capacitor stack, 400, consistent with some embodiments. The capacitor stack includes a first electrode layer, a dielectric layer, and a second electrode layer. The first electrode layer may include a single layer or may include multiple layers as discussed previously. Using the method as outlined in FIG. 1 and described previously, first electrode base layer, 402, is formed above substrate, 401. Generally, the substrate has already received several processing steps in the manufacture of a full DRAM device. First electrode base layer, 402, includes one of metals, conductive metal oxides, conductive metal nitrides, conductive metal silicides, etc. In some embodiments, the conductive base layer includes one of ruthenium, platinum, titanium nitride, tantalum nitride, titanium-aluminum-nitride, tungsten, tungsten nitride, molybdenum, molybdenum nitride, or vanadium nitride. A particularly interesting class of materials for the first electrode base layer is the conductive metal nitrides. In some embodiments, the first electrode base layer includes titanium nitride. The first electrode base layer is typically formed using an ALD, CVD, or PVD technique. The first electrode base layer typically has a thickness between 5 nm and 50 nm, and preferably between 10 nm and 25 nm. In some embodiments, first electrode metal oxide layer (i.e. blocking layer or flash layer), 404, is formed above first electrode base layer, 402. Together, the first electrode base layer and the first electrode metal oxide layer form the first electrode layer of the capacitor stack. The metal oxide portion of the first electrode may be formed using a high temperature, low pressure ALD process as discussed previously. The first electrode metal oxide layer typically has a thickness between 0.1 nm and 1.0 nm. In some embodiments, the first electrode metal oxide layer may include at least one of the compounds of molybdenum oxide, tungsten oxide, ruthenium oxide, iridium oxide, chromium oxide, manganese oxide, cerium oxide, europium oxide, or tin oxide. Specific metal oxide materials of interest are the compounds of molybdenum oxide, ruthenium oxide, manganese oxide, tungsten oxide, and tin oxide. The first electrode layer, (402 and 404), can be annealed to crystallize the layer.

In some embodiments, dielectric layer, 406, would then be formed above the first electrode metal oxide layer, 404. The dielectric layer is typically formed using an ALD, CVD, or PVD technique. The dielectric layer typically has a thickness between 5 nm and 10 nm, and preferably between 5 nm and 8 nm. A wide variety of dielectric materials have been targeted for use in DRAM capacitors. Examples of suitable dielectric materials include aluminum oxide, barium-strontium-titanate (BST), hafnium oxide, hafnium silicate, niobium oxide, lead-zirconium-titanate (PZT), a bilayer of silicon oxide and silicon nitride, silicon oxy-nitride, strontium-titanate (STO), tantalum oxide, titanium oxide, zirconium oxide or doped versions of the same. As used herein, a "dopant" is a minor constituent (generally <=20 atomic %) of a layer or material that is purposely added. As used herein, the dopant may be electrically active or not electrically active. The definition excludes residues and impurities such as carbon, etc. that may be present in the material due to inefficiencies of the process or impurities in the precursor materials. These dielectric materials may be formed as a single layer or may be formed as a hybrid or nanolaminate structure. In some embodiments, the dielectric layer includes doped zirconium oxide. Typical dopants for zirconium oxide include Al, Ce, Co, Er, Ga, Gd, Ge, Hf, In, La, Lu, Mg, Mn, Nd, Pr, Sc, Si, Sn, Sr, Ti, Y, or combinations thereof. Typically, dielectric layer, 406, is subjected to a PDA treatment before the formation of the second electrode layer as discussed previously.

In the next step, the second electrode layer, 408, is formed above dielectric layer, 406. The second electrode layer may include a single layer or may include multiple layers as discussed previously. The second electrode layer is typically formed using an ALD, CVD, or PVD technique. The second electrode layer typically has a thickness between 5 nm and 50 nm, and preferably between 10 nm and 25 nm. The second electrode layer includes one of metals, conductive metal oxides, conductive metal nitrides, conductive metal silicides, conductive metal carbides, or combinations thereof. Optionally, the capacitor stack can then be subjected to a PMA treatment process in an oxidizing atmosphere, wherein the oxidizing atmosphere includes between 0% $O_2$ to 25% $O_2$ and at temperatures between 300 C to 600 C for between 1 millisecond to 60 minutes (not shown). Those skilled in the art will understand that other layers may be included in the capacitor stack. The benefits of the blocking layer may be realized if they are thin (e.g. have a thickness of less than about 15 A), are amorphous (e.g. are less than 30% crystalline after subsequent anneal steps), and are poor conductors (e.g. have resistivity values greater than about 0.01 ohm-cm). The blocking layers must be thick enough to lower the leakage current, but as thin as possible so that they do not decrease the k value of the capacitor stack and increase the EOT.

Figure 5:
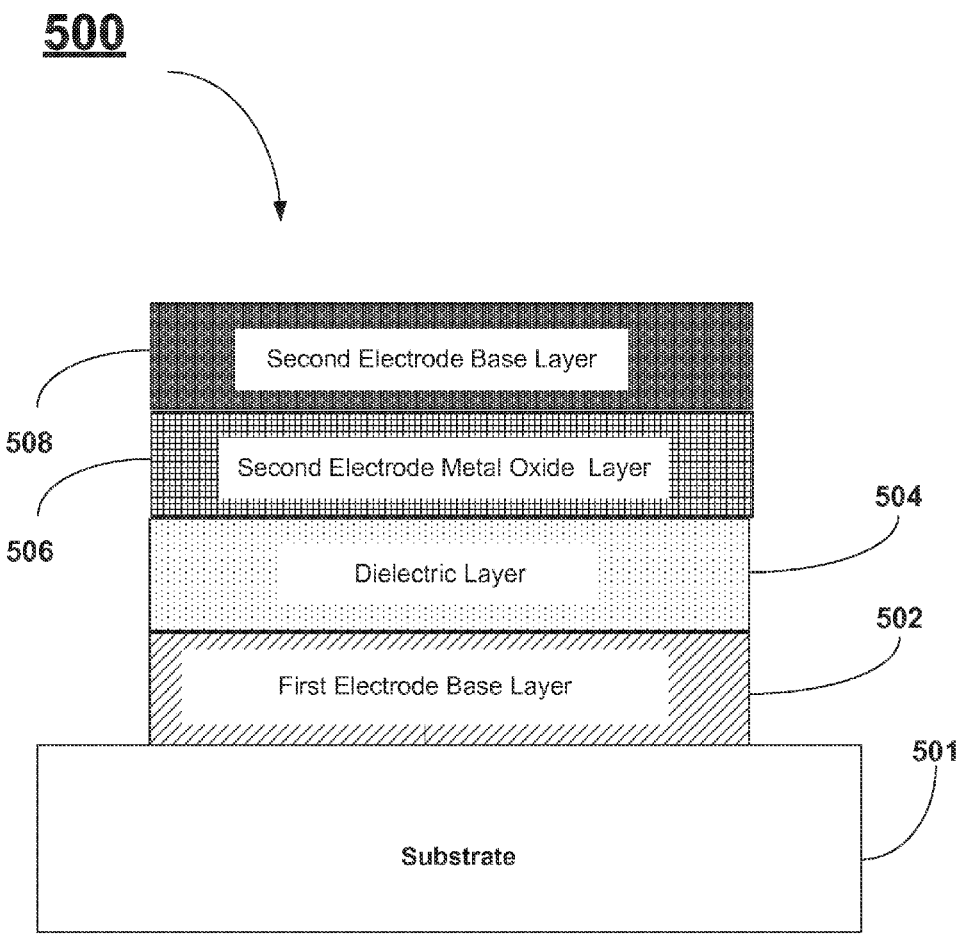
FIG. 5 illustrates a simplified cross-sectional view of a DRAM capacitor stack fabricated in accordance with some embodiments.

FIG. 5 illustrates a simple capacitor stack, 500, consistent with some embodiments. The capacitor stack includes a first electrode layer, a dielectric layer, and a second electrode layer. Using the method as outlined in FIG. 2 and described above, first electrode layer, 502, is formed above substrate, 501. Generally, the substrate has already received several processing steps in the manufacture of a full DRAM device. The first electrode layer may include a single layer or may include multiple layers as discussed previously. The first electrode layer is typically formed using an ALD, CVD, or PVD technique. The first electrode layer typically has a thickness between 5 nm and 50 nm, and preferably between 10 nm and 25 nm. First electrode layer, 502, includes one of metals, conductive metal oxides, conductive metal nitrides, conductive metal silicides, or combinations thereof. In some embodiments, the first electrode layer may include a conductive metal nitride. In some embodiments, the conductive base layer includes titanium nitride. The first electrode layer, 502, can be annealed to crystallize the material.

In some embodiments, dielectric layer, 504, would then be formed above the first electrode layer, 502. The dielectric layer is typically formed using an ALD, CVD, or PVD technique. The dielectric layer typically has a thickness between 5 nm and 10 nm, and preferably between 5 nm and 8 nm. A wide variety of dielectric materials have been targeted for use in DRAM capacitors. Examples of suitable dielectric materials include aluminum oxide, barium-strontium-titanate (BST), hafnium oxide, hafnium silicate, niobium oxide, lead-zirconium-titanate (PZT), a bilayer of silicon oxide and silicon nitride, silicon oxy-nitride, strontium-titanate (STO), tantalum oxide, titanium oxide, zirconium oxide or doped versions of the same. These dielectric materials may be formed as a single layer or may be formed as a hybrid or nanolaminate structure. In some embodiments, the dielectric layer is doped zirconium oxide. Typical dopants for zirconium oxide include Al, Ce, Co, Er, Ga, Gd, Ge, Hf, In, La, Lu, Mg, Mn, Nd, Pr, Sc, Si, Sn, Sr, Ti, Y, or combinations thereof. Typically, dielectric layer, 504, is subjected to a PDA treatment before the formation of the second electrode layer as discussed previously.

The second electrode layer may include a single layer or may include multiple layers as discussed previously. In some embodiments, the second electrode metal oxide layer (i.e. blocking layer or capping layer), 506, is formed above dielectric layer, 504. The metal oxide portion of the second electrode may be formed using a high temperature, low pressure ALD process as discussed previously. The second electrode metal oxide layer typically has a thickness between 0.1 nm and 1.5 nm. The second electrode metal oxide layer may include at least one of the compounds of molybdenum oxide, tungsten oxide, ruthenium oxide, iridium oxide, chromium oxide, manganese oxide, cerium oxide, europium oxide, or tin oxide. Specific metal oxide materials of interest are the compounds of molybdenum oxide, ruthenium oxide, manganese oxide, tungsten oxide, cerium oxide, europium oxide, and tin oxide. In some embodiments, second electrode base layer, 508, is formed above the conductive metal oxide layer, 506. Examples of suitable second electrode base layers include metals, conductive metal oxides, conductive metal silicides, conductive metal nitrides, and combinations thereof. In some embodiments, the conductive base layer includes one of ruthenium, platinum, titanium nitride, tantalum nitride, titanium-aluminum-nitride, tungsten, tungsten nitride, molybdenum, molybdenum nitride, or vanadium nitride. A particularly interesting class of materials for the second electrode base layer is the conductive metal nitrides. In some embodiments, second electrode base layer includes titanium nitride. The second electrode base layer is typically formed using an ALD, CVD, or PVD technique. The second electrode base layer typically has a thickness between 5 nm and 50 nm, and preferably between 10 nm and 25 nm. Together, the second electrode base layer and the second electrode metal oxide layer form the second electrode layer of the capacitor stack. Optionally, the capacitor stack can then be subjected to PMA treatment process in an oxidizing atmosphere, wherein the oxidizing atmosphere includes between 0% $O_2$ to 25% $O_2$ and at temperatures between 300 C to 600 C for between 1 millisecond to 60 minutes (not shown). Those skilled in the art will understand that other layers may be included in the capacitor stack. The benefits of the blocking layer may be realized if they are thin (e.g. have a thickness of less than about 15 A), are amorphous (e.g. are less than 30% crystalline after subsequent anneal steps), and are poor conductors (e.g. have resistivity values greater than about 0.01 ohm-cm). The blocking layers must be thick enough to lower the leakage current, but as thin as possible so that they do not decrease the k value of the capacitor stack and increase the EOT.

Figure 6:
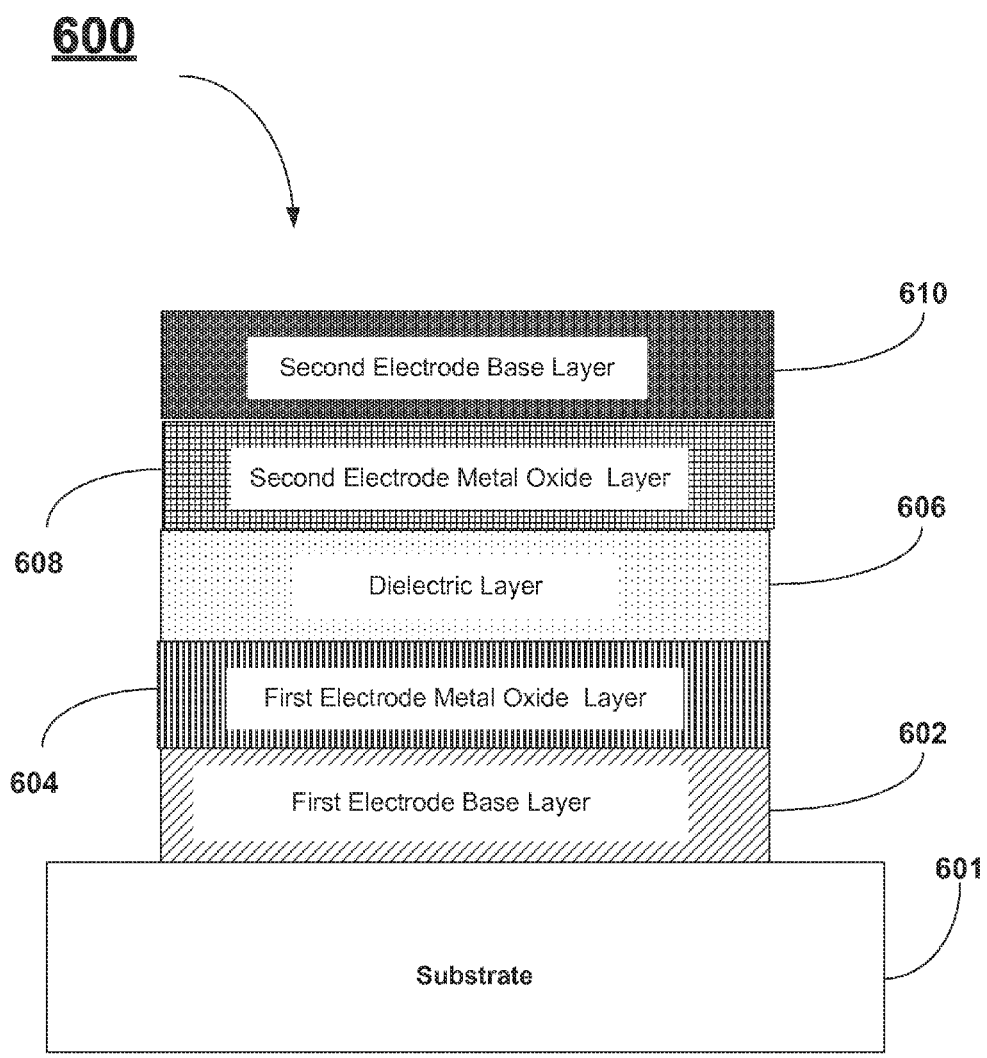
FIG. 6 illustrates a simplified cross-sectional view of a DRAM capacitor stack fabricated in accordance with some embodiments.

FIG. 6 illustrates a simple capacitor stack, 600, consistent with some embodiments. The capacitor stack includes a first electrode layer, a dielectric layer, and a second electrode layer. The first electrode layer may include a single layer or may include multiple layers as discussed previously. Using the method as outlined in FIG. 3 and described above, first electrode base layer, 602, is formed above substrate, 601. First electrode base layer, 602, includes one of metals, conductive metal oxides, conductive metal nitrides, conductive metal silicides, etc. In some embodiments, the conductive base layer includes one of ruthenium, platinum, titanium nitride, tantalum nitride, titanium-aluminum-nitride, tungsten, tungsten nitride, molybdenum, molybdenum nitride, or vanadium nitride. A particularly interesting class of materials for the first electrode base layer is the conductive metal nitrides. In some embodiments, the first electrode base layer includes titanium nitride. The first electrode base layer is typically formed using an ALD, CVD, or PVD technique. In some embodiments, first electrode metal oxide layer (i.e. blocking layer or flash layer), 604, is formed above first electrode base layer, 602. Together, the first electrode base layer and the first electrode metal oxide layer form the first electrode layer of the capacitor stack. The metal oxide portion of the first electrode may be formed using a high temperature, low pressure ALD process as discussed previously. The first electrode metal oxide layer typically has a thickness between 0.1 nm and 1.0 nm. In some embodiments, the first electrode metal oxide layer may include at least one of the compounds of molybdenum oxide, tungsten oxide, ruthenium oxide, iridium oxide, chromium oxide, manganese oxide, cerium oxide, europium oxide, or tin oxide. Specific metal oxide materials of interest are the compounds of molybdenum oxide, ruthenium oxide, manganese oxide, tungsten oxide, cerium oxide, europium oxide, and tin oxide. The first electrode layer, (602 and 604), can be annealed to crystallize the layer.

In some embodiments, dielectric layer, 606, would then be formed above the first electrode metal oxide layer, 604. The dielectric layer is typically formed using an ALD, CVD, or PVD technique. The dielectric layer typically has a thickness between 5 nm and 10 nm, and preferably between 5 nm and 8 nm. A wide variety of dielectric materials have been targeted for use in DRAM capacitors. Examples of suitable dielectric materials include aluminum oxide, barium-strontium-titanate (BST), hafnium oxide, hafnium silicate, niobium oxide, lead-zirconium-titanate (PZT), a bilayer of silicon oxide and silicon nitride, silicon oxy-nitride, strontium-titanate (STO), tantalum oxide, titanium oxide, zirconium oxide or doped versions of the same. As used herein, a "dopant" is a minor constituent (generally <=20 atomic %) of a layer or material that is purposely added. As used herein, the dopant may be electrically active or not electrically active. The definition excludes residues and impurities such as carbon, etc. that may be present in the material due to inefficiencies of the process or impurities in the precursor materials. These dielectric materials may be formed as a single layer or may be formed as a hybrid or nanolaminate structure. In some embodiments, the dielectric layer includes doped zirconium oxide. Typical dopants for zirconium oxide include Al, Ce, Co, Er, Ga, Gd, Ge, Hf, In, La, Lu, Mg, Mn, Nd, Pr, Sc, Si, Sn, Sr, Ti, Y, or combinations thereof. Typically, dielectric layer, 606, is subjected to a PDA treatment before the formation of the second electrode layer as discussed previously.

The second electrode layer may include a single layer or may include multiple layers as discussed previously. In some embodiments, the second electrode metal oxide layer (i.e. blocking layer or capping layer), 608, is formed above dielectric layer, 606. The metal oxide portion of the second electrode may be formed using a high temperature, low pressure ALD process as discussed previously. The second electrode metal oxide layer typically has a thickness between 0.1 nm and 1.5 nm. The second electrode metal oxide layer may include at least one of the conductive compounds of molybdenum oxide, tungsten oxide, ruthenium oxide, iridium oxide, chromium oxide, manganese oxide, cerium oxide, europium oxide, or tin oxide. Specific metal oxide materials of interest are the compounds of molybdenum oxide, ruthenium oxide, manganese oxide, tungsten oxide, cerium oxide, europium oxide, and tin oxide. In some embodiments, second electrode base layer, 610, is formed above the second electrode metal oxide layer, 608. Examples of suitable second electrode base layers include metals, conductive metal oxides, conductive metal silicides, conductive metal nitrides, and combinations thereof. In some embodiments, the conductive base layer includes one of ruthenium, platinum, titanium nitride, tantalum nitride, titanium-aluminum-nitride, tungsten, tungsten nitride, molybdenum, molybdenum nitride, or vanadium nitride. A particularly interesting class of materials for the second electrode base layer is the conductive metal nitrides. In some embodiments, second electrode base layer includes titanium nitride. Together, the second electrode base layer and the second electrode metal oxide layer form the second electrode layer of the capacitor stack. Optionally, the capacitor stack can then be subjected to PMA treatment process in an oxidizing atmosphere, wherein the oxidizing atmosphere includes between 0% $O_2$ to 25% $O_2$ and at temperatures between 300 C to 600 C for between 1 millisecond to 60 minutes (not shown). Those skilled in the art will understand that other layers may be included in the capacitor stack. The benefits of the blocking layer may be realized if they are thin (e.g. have a thickness of less than about 15 A), are amorphous (e.g. are less than 30% crystalline after subsequent anneal steps), and are poor conductors (e.g. have resistivity values greater than about 0.01 ohm-cm). The blocking layers must be thick enough to lower the leakage current, but as thin as possible so that they do not decrease the k value of the capacitor stack and increase the EOT.

Figure 7:
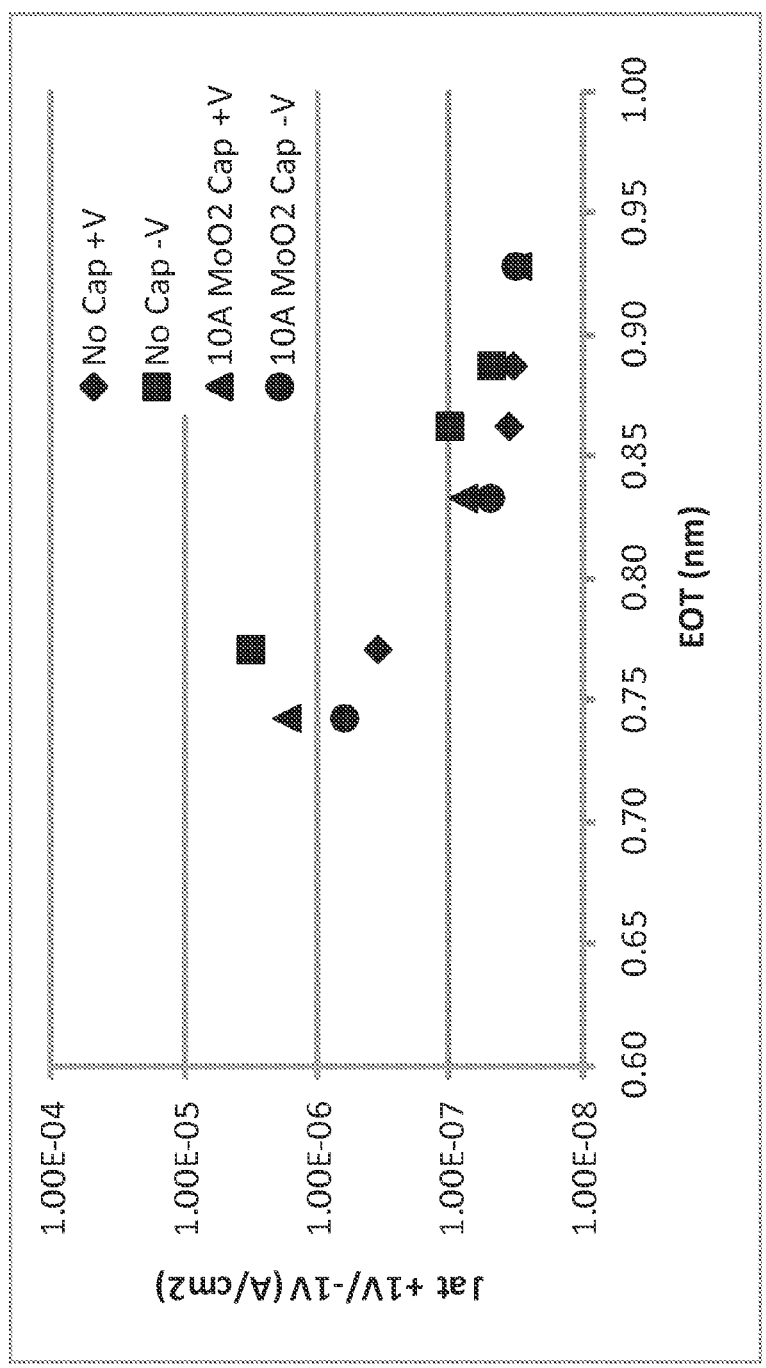
FIG. 7 presents data for leakage current density versus EOT for capacitor stacks fabricated in accordance with some embodiments.

FIG. 7 presents data for leakage current density versus EOT for capacitor stacks fabricated in accordance with some embodiments. All of the capacitor stacks included a first electrode base layer of about 50 nm of titanium nitride. The dielectric layer included a multilayer stack of zirconium oxide and a laminate of Al-doped zirconium oxide. The Al doping was at a level of about 20 atomic %. The dielectric layer was formed in thicknesses between about 50 A and 70 A. One set of samples (labeled "No Cap") did not include a second electrode metal oxide layer. A second set of samples (labeled "10 A MoO2 Cap") included a second electrode metal oxide layer (i.e. blocking or capping layer) of 10 A of molybdenum oxide. All of the capacitor stacks included a second electrode base layer of about 50 nm of titanium nitride. The capacitor stacks were evaluated for capacitance-voltage (CN) response, current-voltage (I/V) response. FIG. 7 presents data for leakage current density versus EOT at both +1V and at -1V for the various samples. It is clear that samples without the second electrode metal oxide layer (i.e. "No Cap" samples) exhibited a difference of the leakage current density for positive bias versus negative bias. As used herein, "positive bias" will be understood to mean that the second electrode is held at a positive voltage relative to the first electrode. In the positive bias configuration, electrons will be injected into the capacitor through the first electrode. As used herein, "negative bias" will be understood to mean that the second electrode is held at a negative voltage relative to the first electrode. In the negative bias configuration, electrons will be injected into the capacitor through the second electrode. Without being bound by theory, the high leakage current density for the "No Cap" samples under negative bias indicates that the barrier to electron injection into the capacitor through the second electrode is small. As discussed previously, the barrier can be increased by inserting a high work function layer between the dielectric layer and the second electrode layer. This is confirmed when comparing the data for leakage current density versus EOT at both +1V and at -1V for the "10 A MoO2 Cap" samples. The leakage current values for these two data sets are similar. Clearly, adding the molybdenum oxide layer between the dielectric layer and the second electrode layer reduces the leakage current density under negative bias. Molybdenum oxide may have a work function greater than about 5.0 eV, depending on processing conditions. Those skilled in the art will note that the leakage current under positive bias is similar for all of the samples. This indicates that the barrier to electron injection into the capacitor through the first electrode is similar, as would be expected. The benefits of the blocking layer may be realized if they are thin (e.g. have a thickness of less than about 15 A), are amorphous (e.g. are less than 30% crystalline after subsequent anneal steps), and are poor conductors (e.g. have resistivity values greater than about 0.01 ohm-cm). The blocking layers must be thick enough to lower the leakage current, but as thin as possible so that they do not decrease the k value of the capacitor stack and increase the EOT.

Figure 8A:
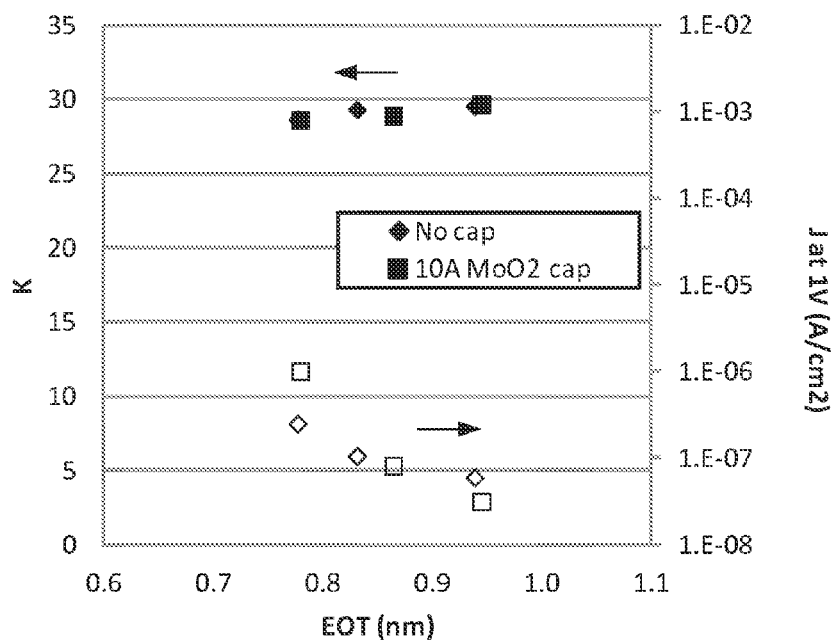
FIGS. 8A-8B present data for leakage current density versus EOT for capacitor stacks fabricated in accordance with some embodiments.
Figure 8B:
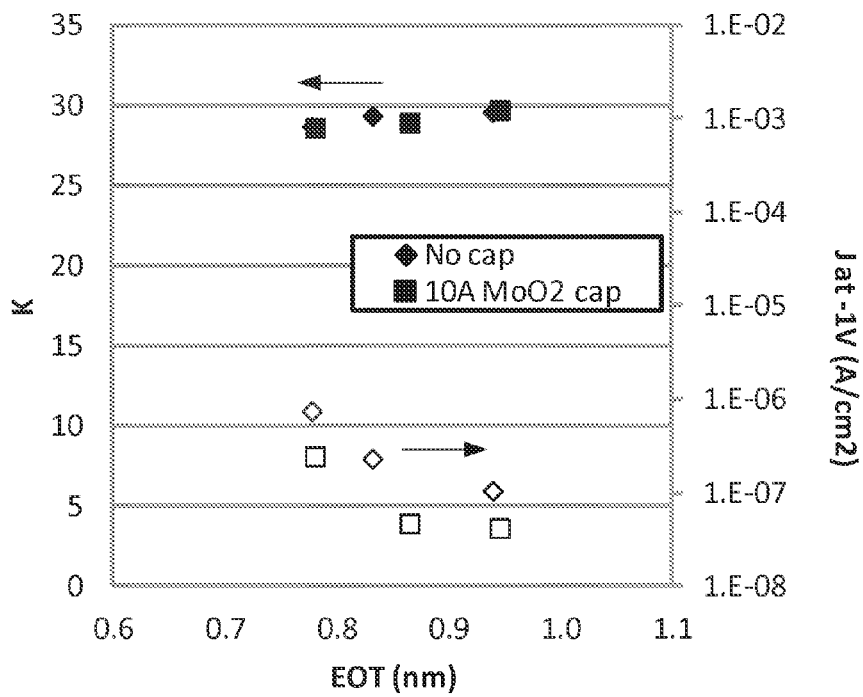

FIGS. 8A and 8B present data for leakage current density versus EOT for capacitor stacks fabricated in accordance with some embodiments. All of the capacitor stacks included a first electrode base layer of about 50 nm of titanium nitride. The dielectric layer included a multilayer stack of zirconium oxide and a laminate of Al-doped zirconium oxide. The Al doping was at a level of about 20 atomic %. The dielectric layer was formed in thicknesses between about 50 A and 70 A by varying the zirconium oxide thickness portion of the stack. One set of samples (labeled "No Cap"), indicated by the closed diamonds (k-value) and the open diamonds (leakage current density), did not include a second electrode metal oxide layer. A second set of samples (labeled "10 A MoO2 Cap"), indicated by the closed squares (k-value) and the open squares (leakage current density), included a second electrode metal oxide layer (i.e. blocking or capping layer) of 10 A of molybdenum oxide. All of the capacitor stacks included a second electrode base layer of about 50 nm of titanium nitride. The capacitor stacks were evaluated for capacitance-voltage (CN) response, current-voltage (I/V) response. FIG. 8A presents data for leakage current density versus EOT at +1V for the various samples. FIG. 8B presents data for leakage current density versus EOT at -1V for the various samples. Those skilled in the art will note that the leakage current under positive bias (FIG. 8A) is similar for all of the samples. This indicates that the barrier to electron injection into the capacitor through the first electrode is similar, as would be expected. Those skilled in the art will note that the leakage current under negative bias (FIG. 8B) is higher for samples without a second electrode metal oxide layer (e.g. No Cap) between the dielectric layer and the second electrode base layer than those with a second electrode metal oxide layer (e.g. 10 A MoO2 Cap) between the dielectric layer and the second electrode base layer. As was discussed with respect to the data in FIG. 7, this indicates that the barrier to electron injection into the capacitor through the second electrode is small, and therefore, the leakage current density is higher. The k-value is essentially constant over the value of EOT investigated. The slight upward trend in the k-value can be attributed to the increasing thickness of the zirconium oxide portion of the stack. These data indicate that several metal oxide materials may be used for the second electrode metal oxide layer. As discussed herein, representative examples include at least one of the compounds of molybdenum oxide, tungsten oxide, ruthenium oxide, iridium oxide, chromium oxide, manganese oxide, cerium oxide, europium oxide, or tin oxide. Specific metal oxide materials of interest are the conductive metal compounds of molybdenum oxide, ruthenium oxide, manganese oxide, tungsten oxide, cerium oxide, europium oxide, and tin oxide.

Figure 8C:
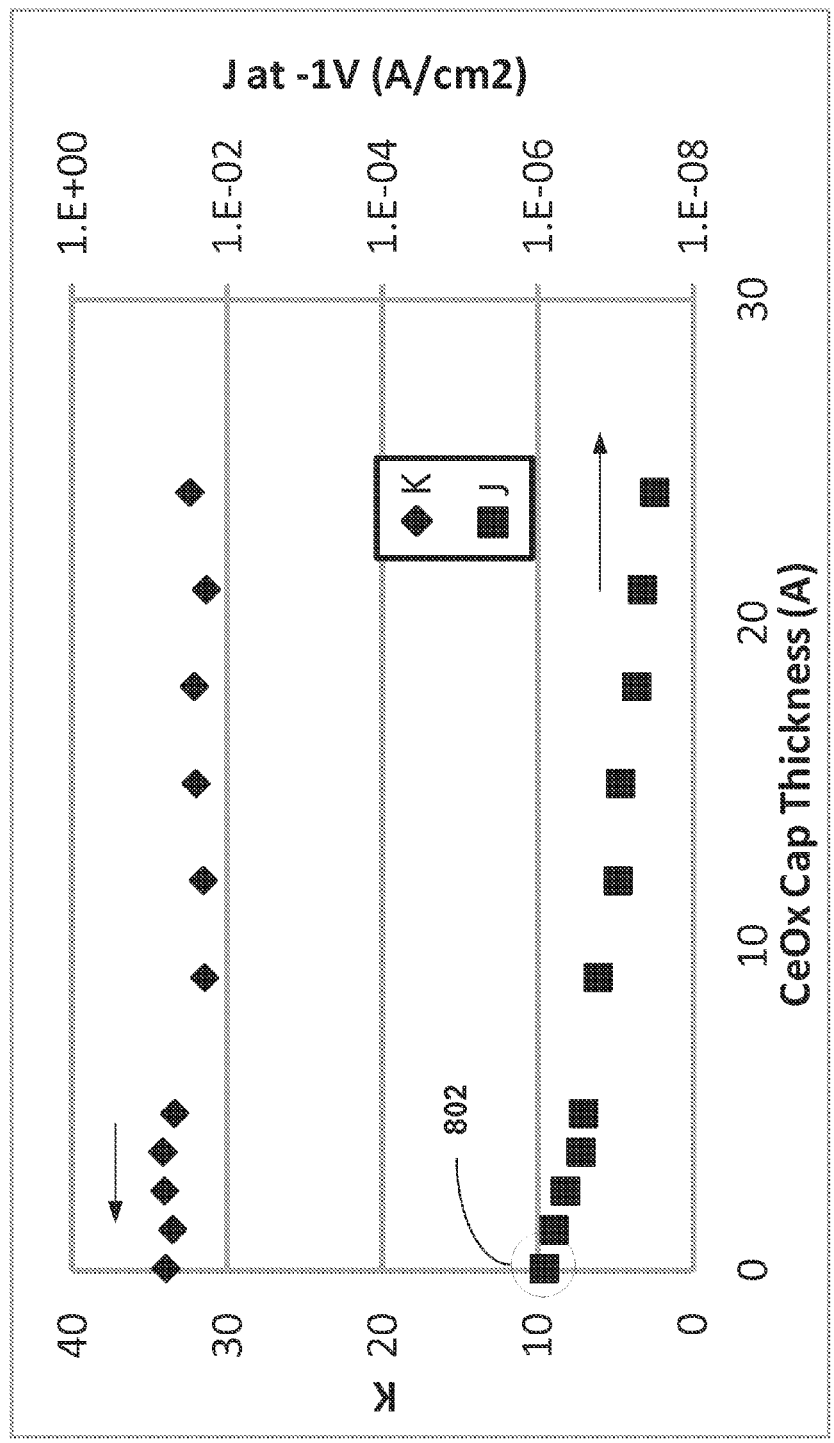
FIG. 8C presents data for leakage current density versus cerium oxide cap thickness for capacitor stacks fabricated in accordance with some embodiments.

FIG. 8C presents data for leakage current density versus cerium oxide cap thickness for capacitor stacks fabricated in accordance with some embodiments. The capacitor stacks included a first electrode base layer of about 50 nm of titanium nitride. The dielectric layer included zirconium oxide. The dielectric layer was formed in thicknesses between about 50 A and 70 A. A second electrode metal oxide layer (i.e. blocking or capping layer) of cerium oxide was formed between the dielectric layer and the titanium nitride second electrode. The thickness of the cerium oxide capping layer was varied from about 1.2 A to about 24 A. As discussed previously, the use of a capping layer with a high work function will have a benefit to lower the leakage current when the device is biased in the negative direction (i.e. the electron injection is from the second electrode). The data presented in FIG. 8C measures the leakage current at -1V (i.e. negative bias). The first data point in the series (i.e. 0 A CeOx) and labeled as 802, represents the leakage for the baseline capacitor stack having no cerium oxide capping layer. As indicated in FIG. 8C, the leakage current decreases as the thickness of the capping layer is increased. The data in FIG. 8C illustrate the benefits of the use of a capping layer with a high work function layer between the dielectric and the electrode. The effect of the capping layer thickness on the k-value is indicated by the diamonds. The measured k-value of the stack decreases as the thickness of the cerium oxide capping layer is increased, due to the lower k-value of cerium oxide. The decrease in the k-value may lead to will lead to an increase in the EOT for advanced devices. The benefits of the blocking layer may be realized if they are thin (e.g. have a thickness of less than about 15 A), are amorphous (e.g. are less than 30% crystalline after subsequent anneal steps), and are poor conductors (e.g. have resistivity values greater than about 0.01 ohm-cm). The useful range of the blocking layer is limited to less than about 15 A because thicker blocking layers tend to decrease the effective k-value of the capacitor stack. The k-value of cerium oxide is less than the zirconium oxide, so the overall k-value will decrease. As discussed previously, this would tend to increase the EOT value of the capacitor.

Figure 8D:
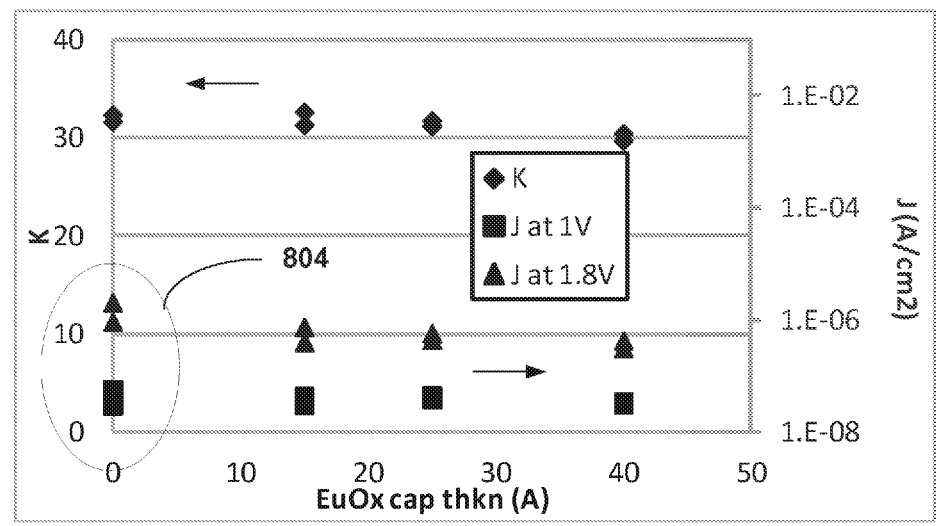
FIGS. 8D-8E present data for leakage current density and k-value versus europium oxide cap thickness for capacitor stacks fabricated in accordance with some embodiments.
Figure 8E:
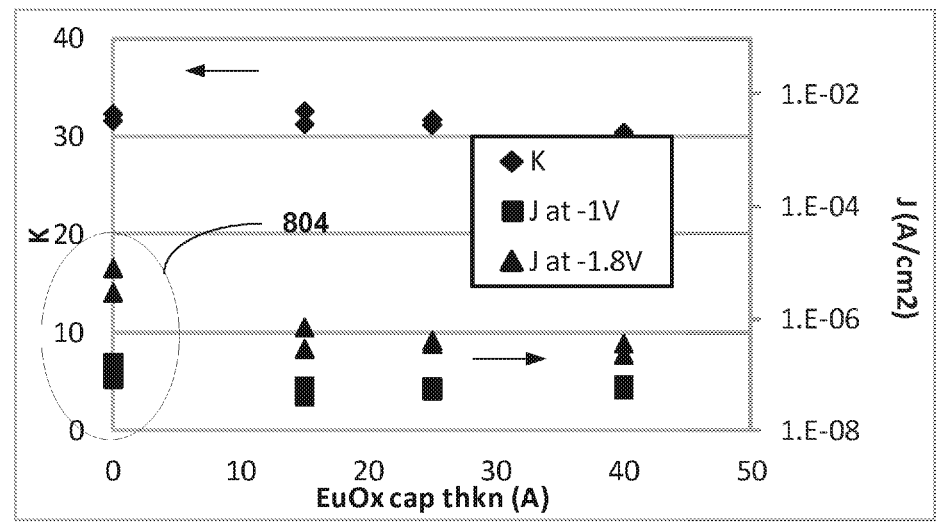

FIGS. 8D and 8E present data for leakage current density versus europium oxide cap thickness for capacitor stacks fabricated in accordance with some embodiments. The capacitor stacks included a first electrode base layer of about 50 nm of titanium nitride. The dielectric layer included zirconium oxide. The dielectric layer was formed in thicknesses between about 50 A and 70 A. A second electrode metal oxide layer (i.e. blocking or capping layer) of europium oxide was formed between the dielectric layer and the titanium nitride second electrode. The thickness of the europium oxide capping layer was varied from about 15 A to about 40 A. As discussed previously, the use of a capping layer with a high work function will have a benefit to lower the leakage current when the device is biased in the negative direction (i.e. the electron injection is from the second electrode). The data presented in FIG. 8D measures the leakage current at +1V (i.e. positive bias), indicated by the squares and at +1.8V (i.e. positive bias), indicated by the triangles. The effect of the capping layer thickness on the k-value is indicated by the diamonds. The data presented in FIG. 8E measures the leakage current at −1V (i.e. negative bias), indicated by the squares and at −1.8V (i.e. negative bias), indicated by the triangles. The effect of the capping layer thickness on the k-value is indicated by the diamonds. As discussed previously, as the thickness of the capping layer increases, the k-value decreases. This will lead to an increase in the EOT for advanced devices. Those skilled in the art will realize that the k-value does not change for europium oxide capping layer thickness between 0 A and 15 A. Increasing the capping layer thickness to more than 15 A decreases the k-value and increases the EOT, with only marginal benefit in the leakage current density. Therefore, it is preferable to maintain the capping layer thickness to between 1 A and 15 A. The first data point in each of the series (i.e. 0 A $EuO_x$) and labeled as 804 in each figure, represents the leakage for the baseline capacitor stack having no europium oxide capping layer. As indicated in FIGS. 8D and 8E, the leakage current decreases as the thickness of the capping layer is increased, especially for negative bias conditions. As discussed previously, the effect is more pronounced for negative bias since the electron injection is from the "top" of the capacitor stack (e.g. through the capping layer). The data also indicate that the benefits of the capping layer are realized to a greater extent for operational conditions of higher voltage (e.g. 1.8 V versus 1.0V). This is true for both the positive bias condition as well as the negative bias condition. The data in FIGS. 8D and 8E illustrate the benefits of the use of a capping layer with a high work function layer between the dielectric and the electrode. The benefits of the blocking layer may be realized if they are thin (e.g. have a thickness of less than about 15 A), are amorphous (e.g. are less than 30% crystalline after subsequent anneal steps), and are poor conductors (e.g. have resistivity values greater than about 0.01 ohm-cm). The useful range of the blocking layer is limited to less than about 15 A because thicker blocking layers tend to decrease the effective k-value of the capacitor stack. The k-value of europium oxide is less than the zirconium oxide, so the overall k-value will decrease. As discussed previously, this would tend to increase the EOT value of the capacitor.

Figure 9:
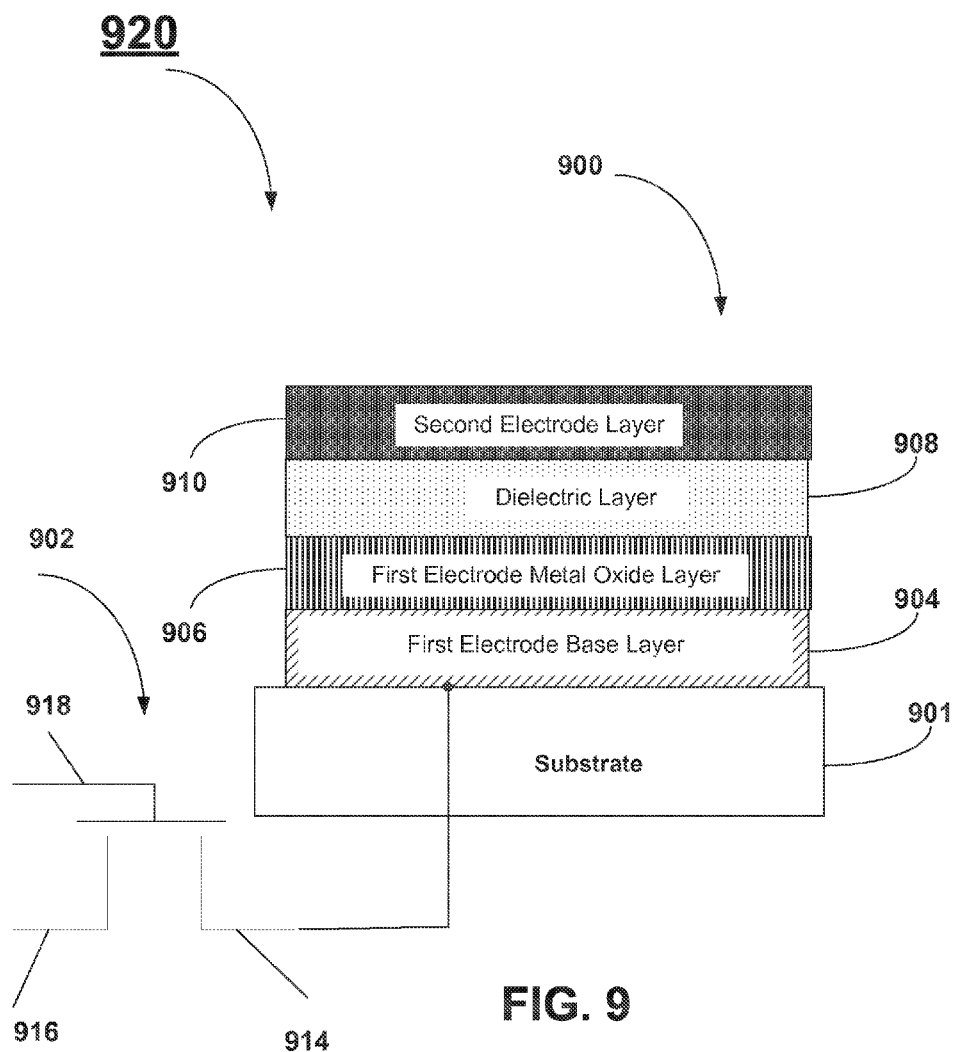
FIG. 9 illustrates a simplified cross-sectional view of a DRAM memory cell fabricated in accordance with some embodiments.

An example of a specific application of some embodiments is in the fabrication of capacitors used in the memory cells in DRAM devices. DRAM memory cells effectively use a capacitor to store charge for a period of time, with the charge being electronically "read" to determine whether a logical "one" or "zero" has been stored in the associated cell. Conventionally, a cell transistor is used to access the cell. The cell transistor is turned "on" in order to store data on each associated capacitor and is otherwise turned "off" to isolate the capacitor and preserve its charge. More complex DRAM cell structures exist, but this basic DRAM structure will be used for illustrating the application of this disclosure to capacitor manufacturing and to DRAM manufacturing. FIG. 9 is used to illustrate one DRAM cell, 920, manufactured using a first electrode structure as discussed previously. The cell, 920, is illustrated schematically to include two principle components, a cell capacitor stack, 900, and a cell transistor, 902. The cell transistor is usually constituted by a MOS transistor having a gate, 918, source, 914, and drain, 916. The gate is usually connected to a word line and one of the source or drain is connected to a bit line. The cell capacitor has a lower or storage electrode and an upper or plate electrode. The storage electrode is connected to the other of the source or drain and the plate electrode is connected to a reference potential conductor. The cell transistor is, when selected, turned "on" by an active level of the word line to read or write data from or into the cell capacitor via the bit line.

As was described previously, the cell capacitor stack, 900, includes a first electrode layer, a dielectric layer, and a second electrode layer. The first electrode layer may include a single layer or may include multiple layers as discussed previously. Using the method as outlined in FIG. 1 and described previously, first electrode base layer, 904, is formed above substrate, 901. Generally, the substrate has already received several processing steps in the manufacture of a full DRAM device. First electrode base layer, 904, includes one of metals, conductive metal oxides, conductive metal nitrides, conductive metal silicides, etc. In some embodiments, the conductive base layer includes one of ruthenium, platinum, titanium nitride, tantalum nitride, titanium-aluminum-nitride, tungsten, tungsten nitride, molybdenum, molybdenum nitride, or vanadium nitride. A particularly interesting class of materials for the first electrode base layer is the conductive metal nitrides. In some embodiments, the first electrode base layer includes titanium nitride. The first electrode base layer is typically formed using an ALD, CVD, or PVD technique. The first electrode base layer typically has a thickness between 5 nm and 50 nm, and preferably between 10 nm and 25 nm. In some embodiments, first electrode metal oxide layer (i.e. blocking layer), 906, is formed above first electrode base layer, 904. Together, the first electrode base layer and the first electrode metal oxide layer form the first electrode layer of the capacitor stack. The metal oxide portion of the first electrode may be formed using a high temperature, low pressure ALD process as discussed previously. The first electrode metal oxide layer typically has a thickness between 0.1 nm and 1.0 nm. In some embodiments, the first electrode metal oxide layer may include at least one of the compounds of molybdenum oxide, tungsten oxide, ruthenium oxide, iridium oxide, chromium oxide cerium oxide, europium oxide, or tin oxide. Specific metal oxide materials of interest are the compounds of molybdenum oxide, ruthenium oxide, manganese oxide, tungsten oxide, cerium oxide, europium oxide, and tin oxide. The first electrode layer, (904 and 906), can be annealed to crystallize the layer.

In some embodiments, dielectric layer, 908, would then be formed above the first electrode metal oxide layer, 906. The dielectric layer is typically formed using an ALD, CVD, or PVD technique. The dielectric layer typically has a thickness between 5 nm and 10 nm, and preferably between 5 nm and 8 nm. A wide variety of dielectric materials have been targeted for use in DRAM capacitors. Examples of suitable dielectric materials include aluminum oxide, barium-strontium-titanate (BST), hafnium oxide, hafnium silicate, niobium oxide, lead-zirconium-titanate (PZT), a bilayer of silicon oxide and silicon nitride, silicon oxy-nitride, strontium-titanate (STO), tantalum oxide, titanium oxide, zirconium oxide or doped versions of the same. As used herein, a "dopant" is a minor constituent (generally <=20 atomic %) of a layer or material that is purposely added. As used herein, the dopant may be electrically active or not electrically active. The definition excludes residues and impurities such as carbon, etc. that may be present in the material due to inefficiencies of the process or impurities in the precursor materials. These dielectric materials may be formed as a single layer or may be formed as a hybrid or nanolaminate structure. In some embodiments, the dielectric layer includes doped zirconium oxide. Typical dopants for zirconium oxide include Al, Ce, Co, Er, Ga, Gd, Ge, Hf, In, La, Lu, Mg, Mn, Nd, Pr, Sc, Si, Sn, Sr, Ti, Y, or combinations thereof. Typically, dielectric layer, 908, is subjected to a PDA treatment before the formation of the second electrode layer as discussed previously.

In the next step, the second electrode layer, 910, is formed above dielectric layer, 908. The second electrode layer may include a single layer or may include multiple layers as discussed previously. The second electrode layer is typically formed using an ALD, CVD, or PVD technique. The second electrode layer typically has a thickness between 5 nm and 50 nm, and preferably between 10 nm and 25 nm. The second electrode layer includes one of metals, conductive metal oxides, conductive metal nitrides, conductive metal silicides, conductive metal carbides, or combinations thereof. Optionally, the capacitor stack can then be subjected to a PMA treatment process in an oxidizing atmosphere, wherein the oxidizing atmosphere includes between 0% $O_2$ to 25% $O_2$ and at temperatures between 300 C to 600 C for between 1 millisecond to 60 minutes (not shown). Those skilled in the art will understand that other layers may be included in the capacitor stack. The benefits of the blocking layer may be realized if they are thin (e.g. have a thickness of less than about 15 A), are amorphous (e.g. are less than 30% crystalline after subsequent anneal steps), and are poor conductors (e.g. have resistivity values greater than about 0.01 ohm-cm).

Figure 10:
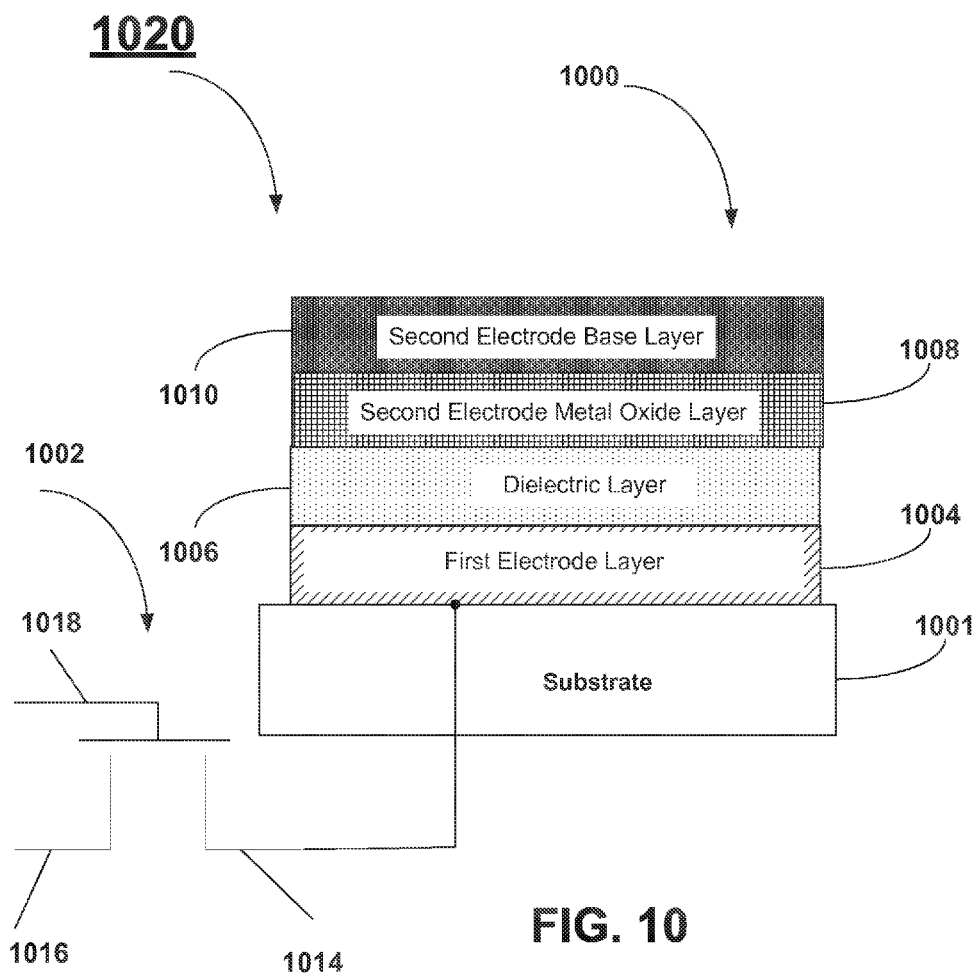
FIG. 10 illustrates a simplified cross-sectional view of a DRAM memory cell fabricated in accordance with some embodiments.

FIG. 10 is used to illustrate one DRAM cell, 1020, manufactured using a first electrode structure as discussed previously. The cell, 1020, is illustrated schematically to include two principle components, a cell capacitor stack, 1000, and a cell transistor, 1002. The cell transistor is usually constituted by a MOS transistor having a gate, 1018, source, 1014, and drain, 1016. The gate is usually connected to a word line and one of the source or drain is connected to a bit line. The cell capacitor has a lower or storage electrode and an upper or plate electrode. The storage electrode is connected to the other of the source or drain and the plate electrode is connected to a reference potential conductor. The cell transistor is, when selected, turned "on" by an active level of the word line to read or write data from or into the cell capacitor via the bit line.

As was described previously, the cell capacitor stack, 1000, includes a first electrode layer, a dielectric layer, and a second electrode layer. Using the method as outlined in FIG. 2 and described above, first electrode layer, 1004, is formed above substrate, 1001. Generally, the substrate has already received several processing steps in the manufacture of a full DRAM device. The first electrode layer may include a single layer or may include multiple layers as discussed previously. The first electrode layer is typically formed using an ALD, CVD, or PVD technique. The first electrode layer typically has a thickness between 5 nm and 50 nm, and preferably between 10 nm and 25 nm. First electrode layer, 1004, includes one of metals, conductive metal oxides, conductive metal nitrides, conductive metal silicides, or combinations thereof. In some embodiments, the conductive metal oxide portion of the first electrode layer is a conductive metal oxide. In some embodiments, the first electrode layer may include a conductive metal nitride. In some embodiments, the conductive base layer includes titanium nitride. The first electrode layer, 1004, can be annealed to crystallize the material.

In some embodiments, dielectric layer, 1006, would then be formed above the first electrode layer, 1004. The dielectric layer is typically formed using an ALD, CVD, or PVD technique. The dielectric layer typically has a thickness between 5 nm and 10 nm, and preferably between 5 nm and 8 nm. A wide variety of dielectric materials have been targeted for use in DRAM capacitors. Examples of suitable dielectric materials include aluminum oxide, barium-strontium-titanate (BST), hafnium oxide, hafnium silicate, niobium oxide, lead-zirconium-titanate (PZT), a bilayer of silicon oxide and silicon nitride, silicon oxy-nitride, strontium-titanate (STO), tantalum oxide, titanium oxide, zirconium oxide or doped versions of the same. These dielectric materials may be formed as a single layer or may be formed as a hybrid or nanolaminate structure. In some embodiments, the dielectric layer is doped zirconium oxide. Typical dopants for zirconium oxide include Al, Ce, Co, Er, Ga, Gd, Ge, Hf, In, La, Lu, Mg, Mn, Nd, Pr, Sc, Si, Sn, Sr, Ti, Y, or combinations thereof. Typically, dielectric layer, 1006, is subjected to a PDA treatment before the formation of the second electrode layer as discussed previously.

The second electrode layer may include a single layer or may include multiple layers as discussed previously. In some embodiments, the second electrode metal oxide layer (i.e. blocking layer), 1008, is formed above dielectric layer, 1006. The metal oxide portion of the second electrode may be formed using a high temperature, low pressure ALD process as discussed previously. The second electrode metal oxide layer typically has a thickness between 0.1 nm and 1.5 nm. The second electrode metal oxide layer may include at least one of the compounds of molybdenum oxide, tungsten oxide, ruthenium oxide, iridium oxide, chromium oxide, manganese oxide, cerium oxide, europium oxide, or tin oxide. Specific metal oxide materials of interest are the compounds of molybdenum oxide, ruthenium oxide, manganese oxide, tungsten oxide, cerium oxide, europium oxide, and tin oxide. In some embodiments, second electrode base layer, 1010, is formed above the metal oxide layer, 1008. Examples of suitable second electrode base layers include metals, conductive metal oxides, conductive metal silicides, conductive metal nitrides, and combinations thereof. In some embodiments, the conductive base layer includes one of ruthenium, platinum, titanium nitride, tantalum nitride, titanium-aluminum-nitride, tungsten, tungsten nitride, molybdenum, molybdenum nitride, or vanadium nitride. A particularly interesting class of materials for the second electrode base layer is the conductive metal nitrides. In some embodiments, second electrode base layer includes titanium nitride. The second electrode base layer is typically formed using an ALD, CVD, or PVD technique. The second electrode base layer typically has a thickness between 5 nm and 50 nm, and preferably between 10 nm and 25 nm. Together, the second electrode base layer and the second electrode metal oxide layer form the second electrode layer of the capacitor stack. Optionally, the capacitor stack can then be subjected to PMA treatment process in an oxidizing atmosphere, wherein the oxidizing atmosphere includes between 0% $O_2$ to 25% $O_2$ and at temperatures between 300 C to 600 C for between 1 millisecond to 60 minutes (not shown). Those skilled in the art will understand that other layers may be included in the capacitor stack. The benefits of the blocking layer may be realized if they are thin (e.g. have a thickness of less than about 15 A), are amorphous (e.g. are less than 30% crystalline after subsequent anneal steps), and are poor conductors (e.g. have resistivity values greater than about 0.01 ohm-cm).

Figure 11:
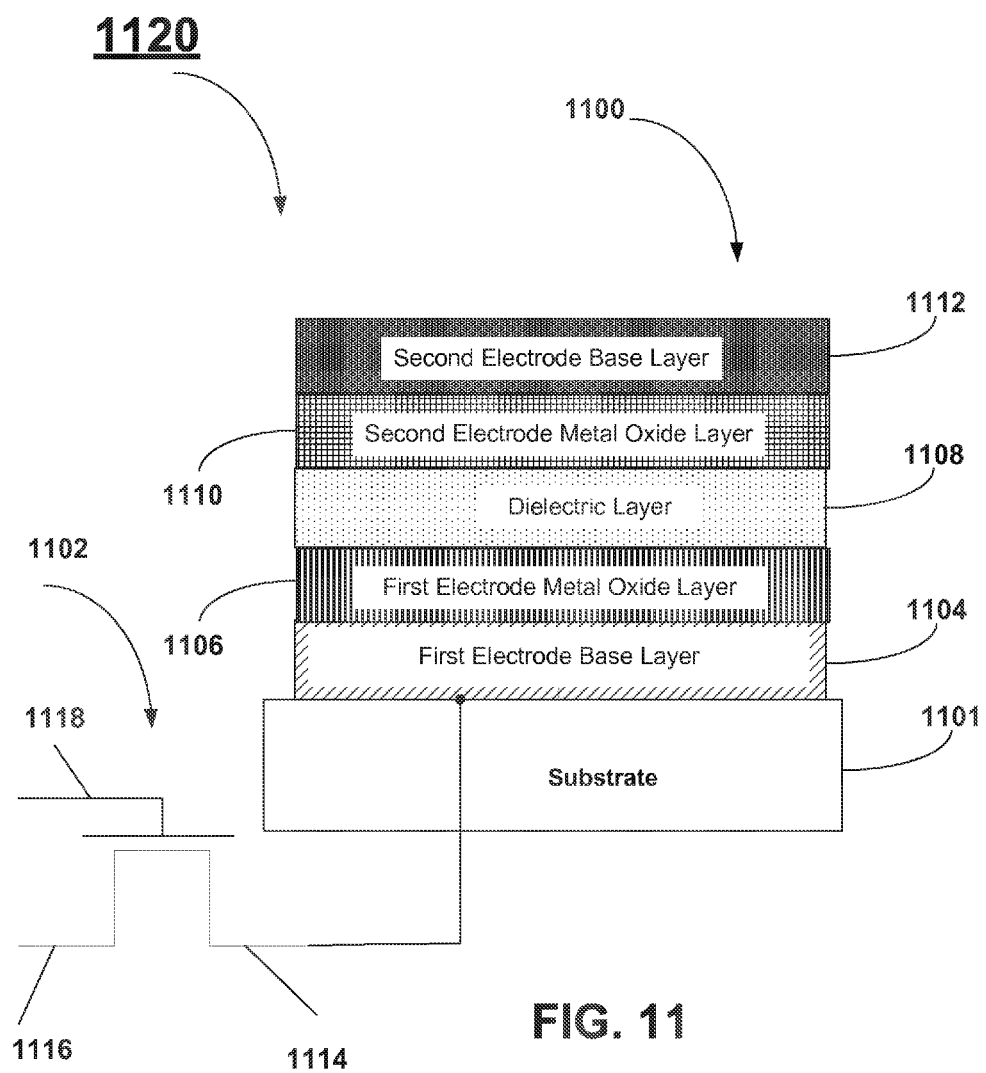
FIG. 11 illustrates a simplified cross-sectional view of a DRAM memory cell fabricated in accordance with some embodiments.

FIG. 11 is used to illustrate one DRAM cell, 1120, manufactured using a first electrode structure as discussed previously. The cell, 1120, is illustrated schematically to include two principle components, a cell capacitor stack, 1100, and a cell transistor, 1102. The cell transistor is usually constituted by a MOS transistor having a gate, 1118, source, 1114, and drain, 1116. The gate is usually connected to a word line and one of the source or drain is connected to a bit line. The cell capacitor has a lower or storage electrode and an upper or plate electrode. The storage electrode is connected to the other of the source or drain and the plate electrode is connected to a reference potential conductor. The cell transistor is, when selected, turned "on" by an active level of the word line to read or write data from or into the cell capacitor via the bit line.

As was described previously, the cell capacitor stack, 1100, includes a first electrode layer, a dielectric layer, and a second electrode layer. The first electrode layer may include a single layer or may include multiple layers as discussed previously. Using the method as outlined in FIG. 3 and described above, first electrode base layer, 1104, is formed above substrate, 1101. First electrode base layer, 1104, includes one of metals, conductive metal oxides, conductive metal nitrides, conductive metal silicides, etc. In some embodiments, the conductive base layer includes one of ruthenium, platinum, titanium nitride, tantalum nitride, titanium-aluminum-nitride, tungsten, tungsten nitride, molybdenum, molybdenum nitride, or vanadium nitride. A particularly interesting class of materials for the first electrode base layer is the conductive metal nitrides. In some embodiments, the first electrode base layer includes titanium nitride. The first electrode base layer is typically formed using an ALD, CVD, or PVD technique. In some embodiments, first electrode metal oxide layer (i.e. blocking layer), 1106, is formed above first electrode base layer, 1104. Together, the first electrode base layer and the first electrode metal oxide layer form the first electrode layer of the capacitor stack. The metal oxide portion of the first electrode may be formed using a high temperature, low pressure ALD process as discussed previously. The first electrode metal oxide layer typically has a thickness between 0.1 nm and 1.0 nm. In some embodiments, the first electrode metal oxide layer may include at least one of the compounds of molybdenum oxide, tungsten oxide, ruthenium oxide, iridium oxide, chromium oxide, manganese oxide, cerium oxide, europium oxide, or tin oxide. Specific metal oxide materials of interest are the compounds of molybdenum oxide, ruthenium oxide, manganese oxide, tungsten oxide, cerium oxide, europium oxide, and tin oxide. The first electrode layer, (1104 and 1106), can be annealed to crystallize the layer.

In some embodiments, dielectric layer, 1108, would then be formed above the first electrode metal oxide layer, 1106. The dielectric layer is typically formed using an ALD, CVD, or PVD technique. The dielectric layer typically has a thickness between 5 nm and 10 nm, and preferably between 5 nm and 8 nm. A wide variety of dielectric materials have been targeted for use in DRAM capacitors. Examples of suitable dielectric materials include aluminum oxide, barium-strontium-titanate (BST), hafnium oxide, hafnium silicate, niobium oxide, lead-zirconium-titanate (PZT), a bilayer of silicon oxide and silicon nitride, silicon oxy-nitride, strontium-titanate (STO), tantalum oxide, titanium oxide, zirconium oxide or doped versions of the same. As used herein, a "dopant" is a minor constituent (generally <=20 atomic %) of a layer or material that is purposely added. As used herein, the dopant may be electrically active or not electrically active. The definition excludes residues and impurities such as carbon, etc. that may be present in the material due to inefficiencies of the process or impurities in the precursor materials. These dielectric materials may be formed as a single layer or may be formed as a hybrid or nanolaminate structure. In some embodiments, the dielectric layer includes doped zirconium oxide. Typical dopants for zirconium oxide include Al, Ce, Co, Er, Ga, Gd, Ge, Hf, In, La, Lu, Mg, Mn, Nd, Pr, Sc, Si, Sn, Sr, Ti, Y, or combinations thereof. Typically, dielectric layer, 1108, is subjected to a PDA treatment before the formation of the second electrode layer as discussed previously.

The second electrode layer may include a single layer or may include multiple layers as discussed previously. In some embodiments, the second electrode metal oxide layer (i.e. blocking layer or capping layer), 1110, is formed above dielectric layer, 1108. The metal oxide portion of the second electrode may be formed using a high temperature, low pressure ALD process as discussed previously. The second electrode metal oxide layer typically has a thickness between 0.1 nm and 1.5 nm. The second electrode metal oxide layer may include at least one of the compounds of molybdenum oxide, tungsten oxide, ruthenium oxide, iridium oxide, chromium oxide, manganese oxide cerium oxide, europium oxide, or tin oxide. Specific metal oxide materials of interest are the compounds of molybdenum oxide, ruthenium oxide, manganese oxide, tungsten oxide, cerium oxide, europium oxide, and tin oxide. In some embodiments, second electrode base layer, 1112, is formed above the second electrode metal oxide layer, 1110. Examples of suitable second electrode base layers include metals, conductive metal oxides, conductive metal silicides, conductive metal nitrides, and combinations thereof. In some embodiments, the conductive base layer includes one of ruthenium, platinum, titanium nitride, tantalum nitride, titanium-aluminum-nitride, tungsten, tungsten nitride, molybdenum, molybdenum nitride, or vanadium nitride. A particularly interesting class of materials for the second electrode base layer is the conductive metal nitrides. In some embodiments, second electrode base layer includes titanium nitride. Together, the second electrode base layer and the second electrode metal oxide layer form the second electrode layer of the capacitor stack. Optionally, the capacitor stack can then be subjected to PMA treatment process in an oxidizing atmosphere, wherein the oxidizing atmosphere includes between 0% $O_2$ to 25% $O_2$ and at temperatures between 300 C to 600 C for between 1 millisecond to 60 minutes (not shown). Those skilled in the art will understand that other layers may be included in the capacitor stack. The benefits of the blocking layer may be realized if they are thin (e.g. have a thickness of less than about 15 A), are amorphous (e.g. are less than 30% crystalline after subsequent anneal steps), and are poor conductors (e.g. have resistivity values greater than about 0.01 ohm-cm).

Although the foregoing examples have been described in some detail for purposes of clarity of understanding, the invention is not limited to the details provided. There are many alternative ways of implementing the invention. The disclosed examples are illustrative and not restrictive.

What is claimed:

1. A method for forming a capacitor stack, the method comprising:
    forming a first electrode layer above a substrate;
    forming a first blocking layer on the first electrode layer,
        wherein the first blocking layer comprises a first metal oxide,
        wherein the first blocking layer has a thickness between 1 A and 15 A, and
        wherein the first metal oxide is less than 30% crystalline and has a resistivity greater than 0.01 ohm-cm;
    forming a dielectric layer above the first blocking layer,
        wherein the dielectric layer is substantially all crystalline;
    forming a second blocking layer on the dielectric layer,
        wherein the second blocking layer comprises a second metal oxide,
        wherein the second blocking layer has a thickness between 1 A and 15 A, and
        wherein the second metal oxide is less than 30% crystalline and has a resistivity greater than 0.01 ohm-cm; and
    forming a second electrode layer above the dielectric layer.

2. The method of claim 1, wherein the first electrode layer comprises one of ruthenium, platinum, titanium nitride, tantalum nitride, titanium-aluminum-nitride, tungsten, tungsten nitride, molybdenum, molybdenum nitride, or vanadium nitride.

3. The method of claim 1, wherein the first metal oxide comprises one of molybdenum oxide, tungsten oxide, ruthenium oxide, iridium oxide, chromium oxide, manganese oxide, cerium oxide, europium oxide, or tin oxide.

4. The method of claim 3, wherein the first metal oxide comprises molybdenum oxide.

5. The method of claim 1, wherein the dielectric layer comprises one of aluminum oxide, barium-strontium-titanate (BST), hafnium oxide, hafnium silicate, niobium oxide, lead-zirconium-titanate (PZT), a bilayer of silicon oxide and silicon nitride, silicon oxy-nitride, strontium-titanate (STO), tantalum oxide, titanium oxide, zirconium oxide or doped versions of the same.

6. The method of claim 5, wherein the dielectric layer comprises zirconium oxide or a doped version of the same.

7. The method of claim 6, wherein the dielectric layer further comprises a dopant comprising at least one of Al, Ce, Co, Er, Ga, Gd, Ge, Hf, In, La, Lu, Mg, Mn, Nd, Pr, Sc, Si, Sn, Sr, Y, or Zr.

8. The method of claim 1, further comprising annealing the first electrode layer, wherein the first electrode layer is annealed before the forming of the dielectric layer.

9. The method of claim 8, wherein the first electrode layer is annealed in a reducing atmosphere comprising between about 0% and about 10% $H_2$ in $N_2$ or other inert gases at a temperature between about 400 C and about 650 C for between 1 millisecond and about 60 minutes.

10. The method of claim 1, further comprising annealing the first electrode layer and the dielectric layer, wherein the first electrode layer and the dielectric layer are annealed before the forming of the second electrode layer.

11. The method of claim 10, wherein the first electrode layer and the dielectric layer are annealed in an oxidizing atmosphere comprising between 0% $O_2$ to 100% $O_2$ in $N_2$ and at temperatures between 300 C to 600 C for between 1 millisecond to 60 minutes.

12. The method of claim 11, wherein the oxidizing atmosphere comprises between 0% $O_2$ to 25% $O_2$ in $N_2$.

13. The method of claim 1, wherein the second electrode layer comprises one of ruthenium, platinum, titanium nitride, tantalum nitride, titanium-aluminum-nitride, tungsten, tungsten nitride, molybdenum, molybdenum nitride, or vanadium nitride.

14. The method of claim 13, wherein the second electrode layer comprises titanium nitride.

15. The method of claim 1, wherein the second metal oxide comprises one of molybdenum oxide, tungsten oxide, ruthenium oxide, iridium oxide, chromium oxide, manganese oxide, cerium oxide, europium oxide, or tin oxide.

16. The method of claim 15, wherein the second metal oxide comprises molybdenum oxide.

17. The method of claim 15, wherein the second metal oxide comprises cerium oxide.

18. The method of claim 1, further comprising annealing the first electrode layer, the dielectric layer, and the second electrode layer in an oxidizing environment after the forming of the second electrode.

19. The method of claim 18, wherein the oxidizing environment comprises between 0% $O_2$ to 25% $O_2$ and at temperatures between 300 C to 600 C for between 1 millisecond to 60 minutes.

* * * * *